United States Patent
Hasegawa et al.

(10) Patent No.: US 10,998,300 B2
(45) Date of Patent: May 4, 2021

(54) DISPLAY UNIT

(71) Applicant: Sony Semiconductor Solutions Corporation, Kanagawa (JP)

(72) Inventors: Toshiaki Hasegawa, Kanagawa (JP);
Kenichi Aoyagi, Kanagawa (JP);
Nobutatsu Araki, Kanagawa (JP);
Tsuyoshi Jyouno, Kanagawa (JP);
Katsunori Ootsubo, Kanagawa (JP);
Yoshiya Hagimoto, Kanagawa (JP);
Yasuhiro Mizuma, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 72 days.

(21) Appl. No.: 15/544,585

(22) PCT Filed: Dec. 16, 2015

(86) PCT No.: PCT/JP2015/085171
§ 371 (c)(1),
(2) Date: Jul. 19, 2017

(87) PCT Pub. No.: WO2016/121258
PCT Pub. Date: Aug. 4, 2016

(65) Prior Publication Data
US 2018/0277528 A1    Sep. 27, 2018

(30) Foreign Application Priority Data
Jan. 29, 2015    (JP) .............................. JP2015-015843

(51) Int. Cl.
*H01L 25/16*     (2006.01)
*H01L 25/075*    (2006.01)
(Continued)

(52) U.S. Cl.
CPC ........ *H01L 25/167* (2013.01); *H01L 23/5383* (2013.01); *H01L 23/5386* (2013.01);
(Continued)

(58) Field of Classification Search
CPC .................................................... H01L 25/167
See application file for complete search history.

(56) References Cited

U.S. PATENT DOCUMENTS

2002/0000561 A1* 1/2002 Yamagata ........... H01L 51/5262
257/81
2002/0135543 A1* 9/2002 Kitamura ............. G09G 3/2096
345/55
(Continued)

FOREIGN PATENT DOCUMENTS

JP    2002-083689 A    3/2002
JP    2002-182580 A    6/2002
(Continued)

OTHER PUBLICATIONS

Written Opinion and English translation thereof dated Mar. 8, 2016 in connection with International Application No. PCT/JP2015/085171.
(Continued)

*Primary Examiner* — Omar F Mojaddedi
(74) *Attorney, Agent, or Firm* — Wolf, Greenfield & Sacks, P.C.

(57) ABSTRACT

A display unit is provided, on a substrate, with a first wiring layer and a device section. The device section has a plurality of pixels. The device section includes, in each of the pixels, a light-emitting device section and a drive device. The light-emitting device section includes a light-emitting device and a light-emitting surface. The drive device drives the light-emitting device section and is electrically coupled to the light-emitting device section through the first wiring
(Continued)

layer. An end of the light-emitting surface of the light-emitting device section is disposed at a position as high as an upper end of the drive device, or at a position higher than the upper end.

19 Claims, 26 Drawing Sheets

(51) Int. Cl.
    *H01L 23/538* (2006.01)
    *H01L 23/498* (2006.01)
    *H01L 33/62* (2010.01)
    *H01L 33/48* (2010.01)
    *H01L 33/54* (2010.01)
    *H01L 33/58* (2010.01)
    *H01L 23/00* (2006.01)

(52) U.S. Cl.
    CPC .......... *H01L 23/5389* (2013.01); *H01L 24/19* (2013.01); *H01L 24/20* (2013.01); *H01L 24/24* (2013.01); *H01L 25/0753* (2013.01); *H01L 33/58* (2013.01); *H01L 33/54* (2013.01); *H01L 33/62* (2013.01); *H01L 2224/16225* (2013.01); *H01L 2224/18* (2013.01); *H01L 2224/214* (2013.01); *H01L 2224/24105* (2013.01); *H01L 2224/24137* (2013.01); *H01L 2924/12041* (2013.01); *H01L 2924/1426* (2013.01); *H01L 2924/15174* (2013.01); *H01L 2924/15311* (2013.01); *H01L 2924/181* (2013.01); *H01L 2933/005* (2013.01); *H01L 2933/0058* (2013.01); *H01L 2933/0066* (2013.01)

(56) References Cited

U.S. PATENT DOCUMENTS

| | | | |
|---|---|---|---|
| 2003/0025657 A1* | 2/2003 | Iwafuchi | H01L 25/167 345/82 |
| 2006/0011913 A1 | 1/2006 | Yamazaki | |
| 2009/0051278 A1 | 2/2009 | Saneto et al. | |
| 2012/0256814 A1* | 10/2012 | Ootorii | G09G 3/3208 345/82 |
| 2015/0262984 A1* | 9/2015 | Krabe | H01L 24/20 257/82 |

FOREIGN PATENT DOCUMENTS

| | | |
|---|---|---|
| JP | 2005-266616 A | 9/2005 |
| JP | 2006-065305 A | 3/2006 |
| JP | 2009-070814 A | 4/2009 |
| JP | 2013-221991 A | 10/2013 |

OTHER PUBLICATIONS

International Preliminary Report on Patentability and English translation thereof dated Aug. 10, 2017 in connection with International Application No. PCT/JP2015/085171.

\* cited by examiner

[ FIG. 1 ]
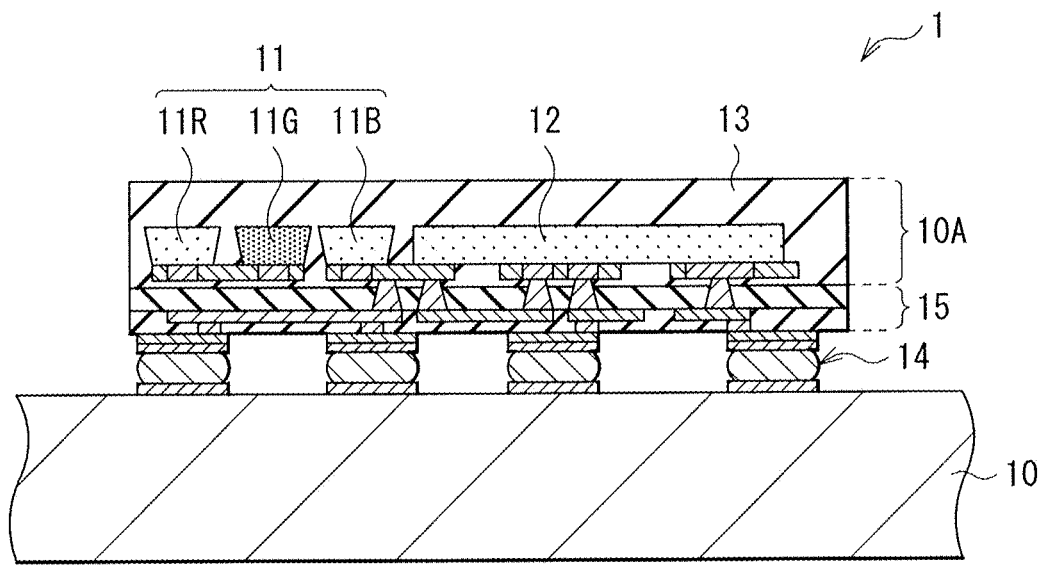
[ FIG. 2 ]
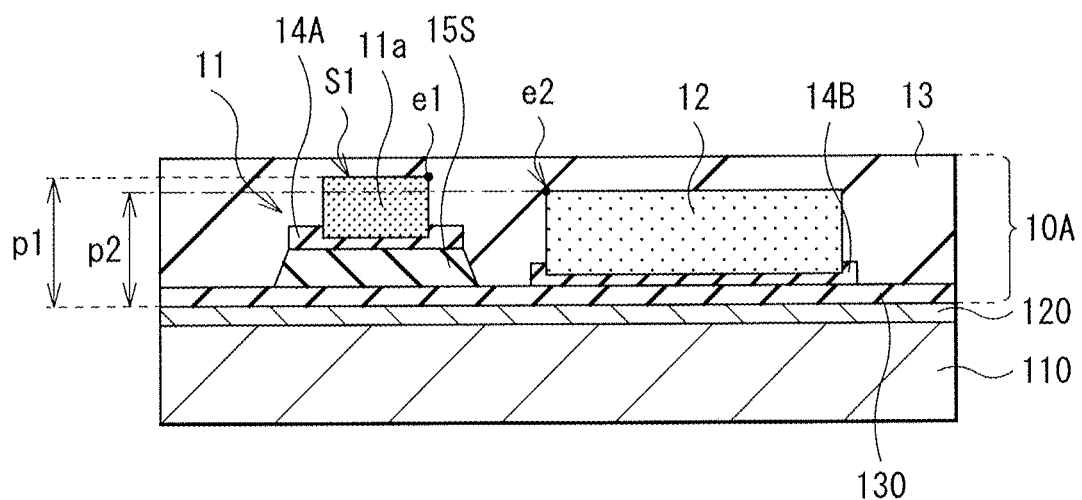

[ FIG. 3 ]
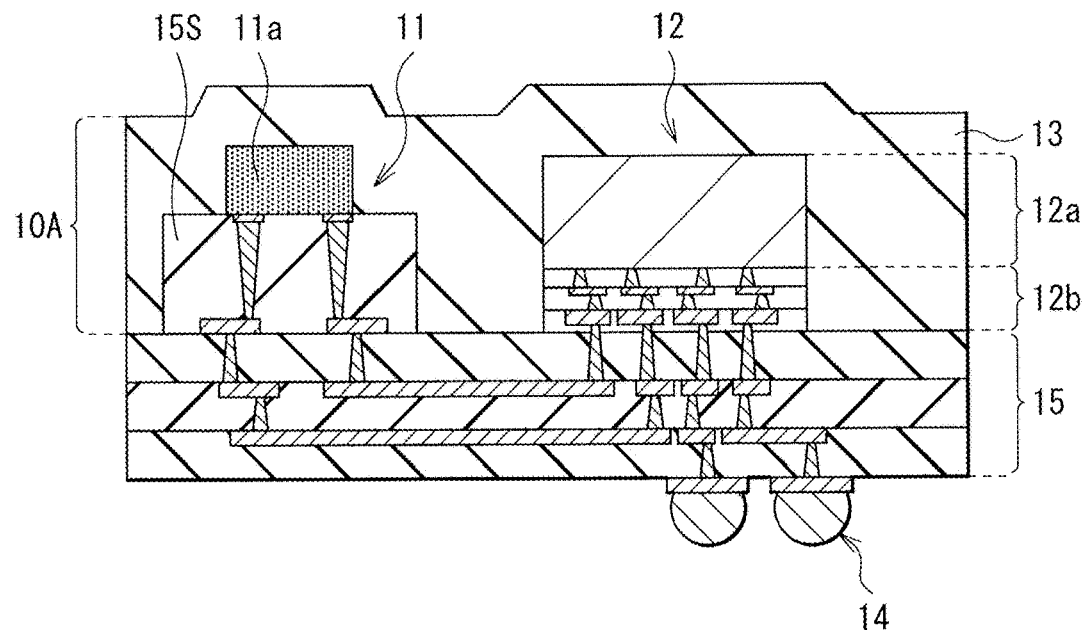
[ FIG. 4A ]
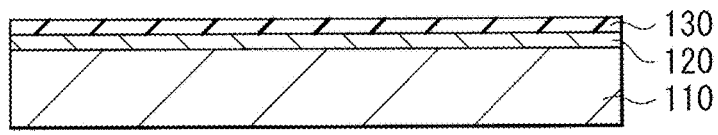
[ FIG. 4B ]
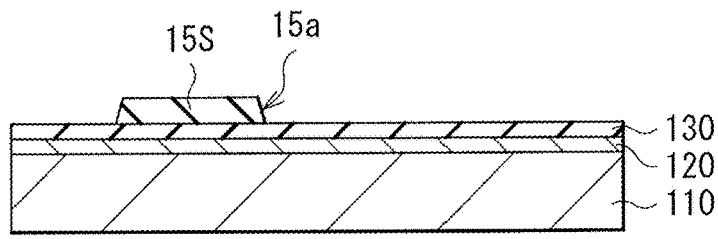
[ FIG. 4C ]
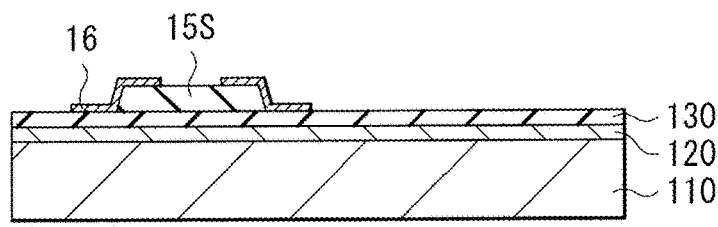

[ FIG. 4D ]
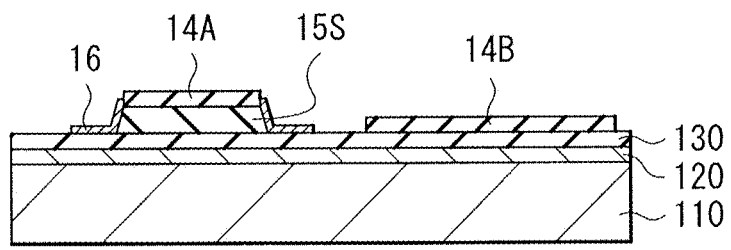
[ FIG. 4E ]
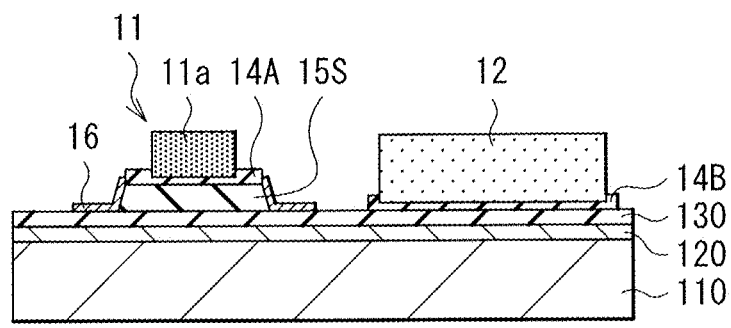
[ FIG. 4F ]
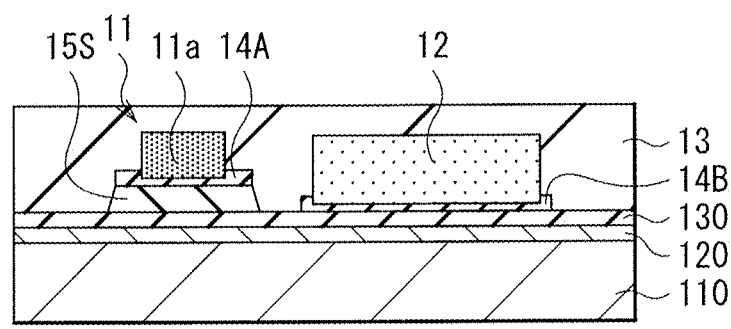

[ FIG. 5 ]
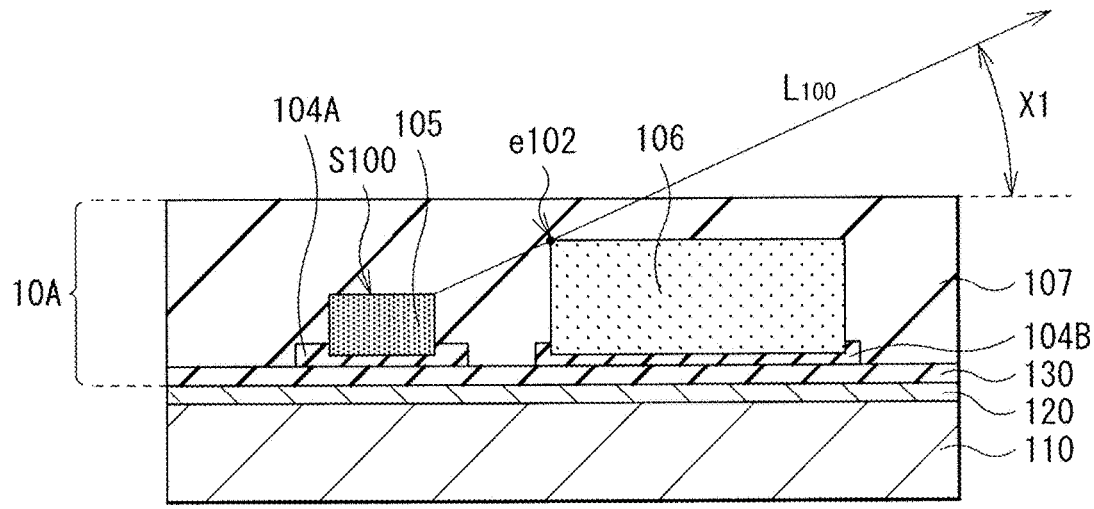
[ FIG. 6 ]
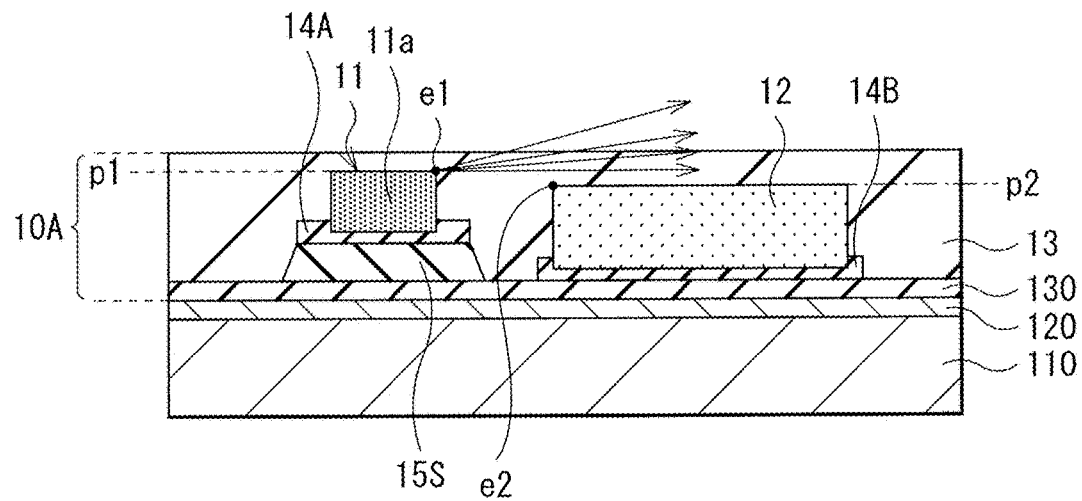
[ FIG. 7 ]
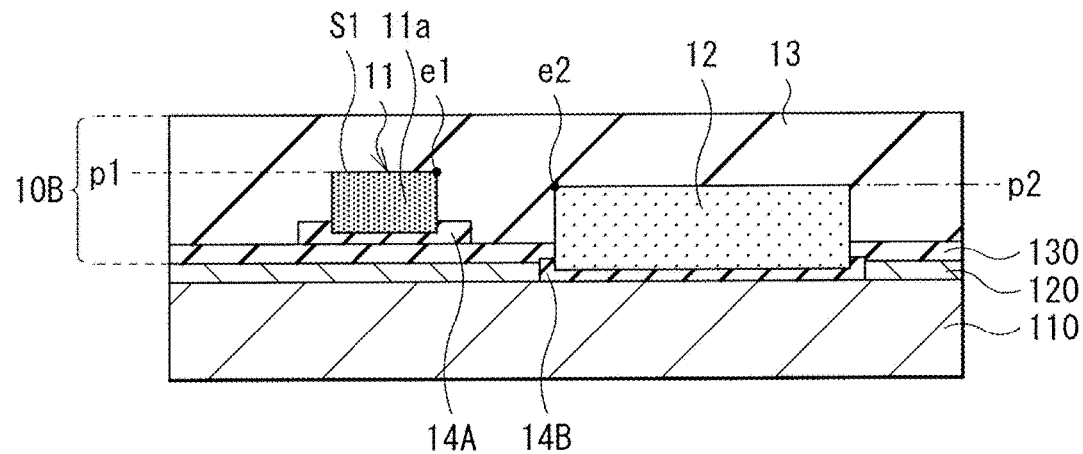

[ FIG. 8A ]
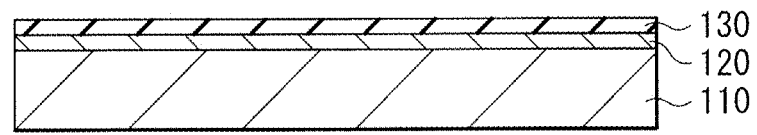
[ FIG. 8B ]
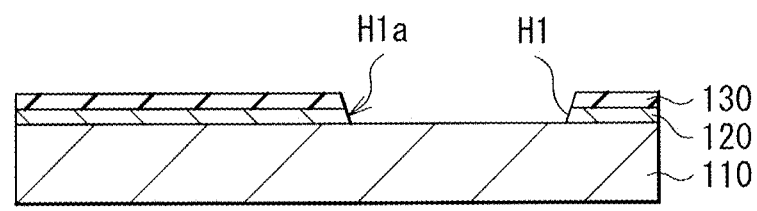
[ FIG. 8C ]
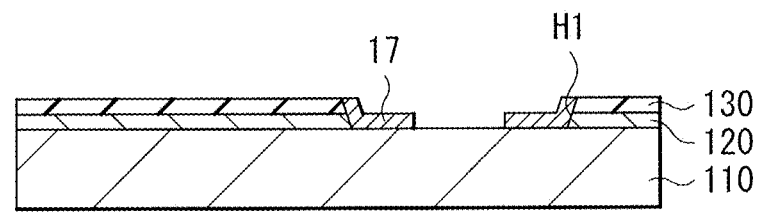

[ FIG. 8D ]
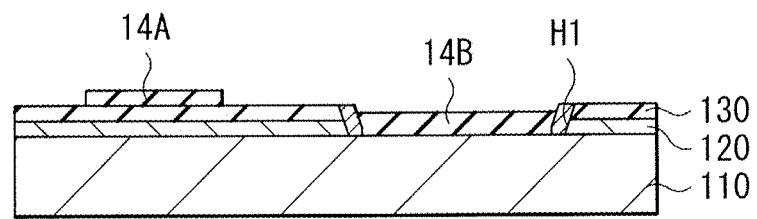
[ FIG. 8E ]
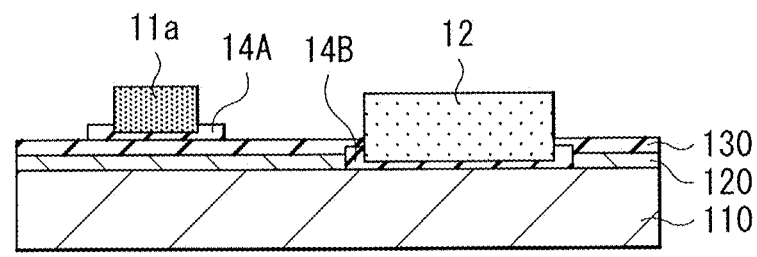
[ FIG. 8F ]
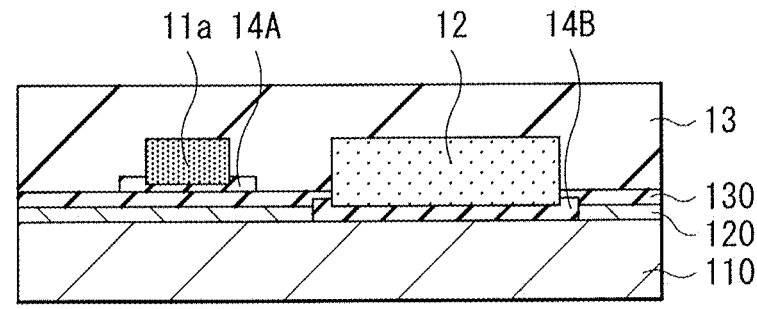

[ FIG. 9 ]
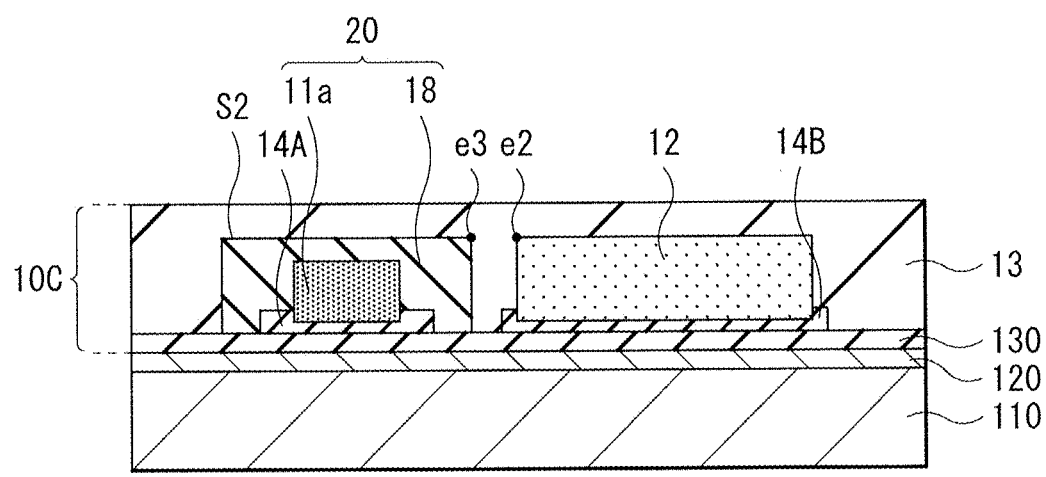
[ FIG. 10 ]
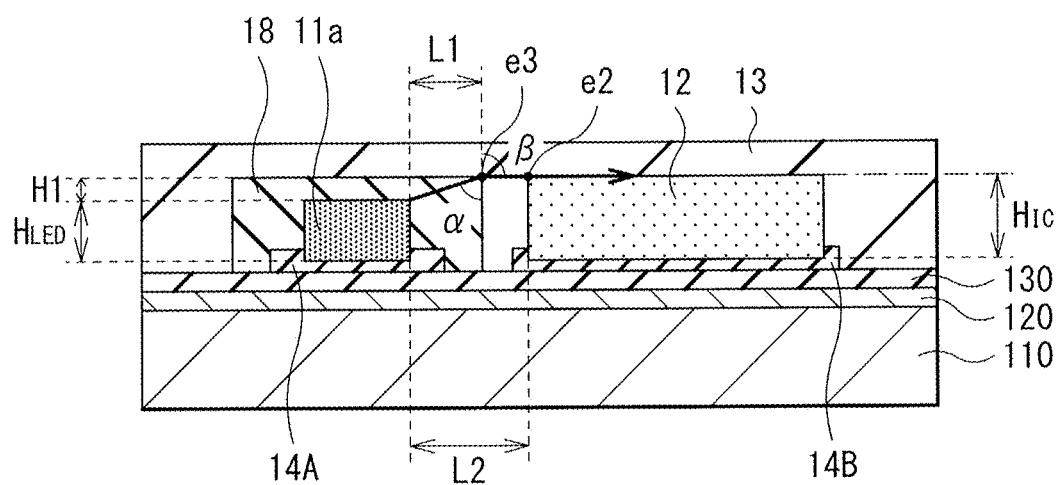

[ FIG. 11A ]
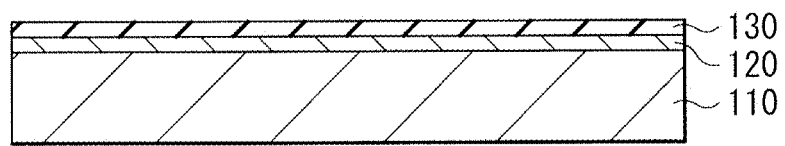
[ FIG. 11B ]
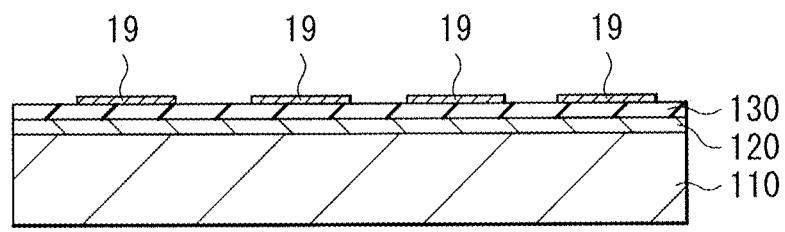
[ FIG. 11C ]
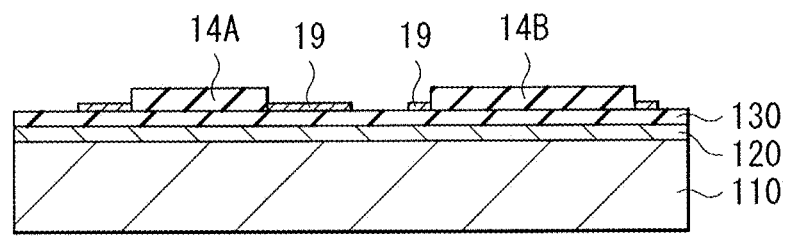

[ FIG. 11D ]
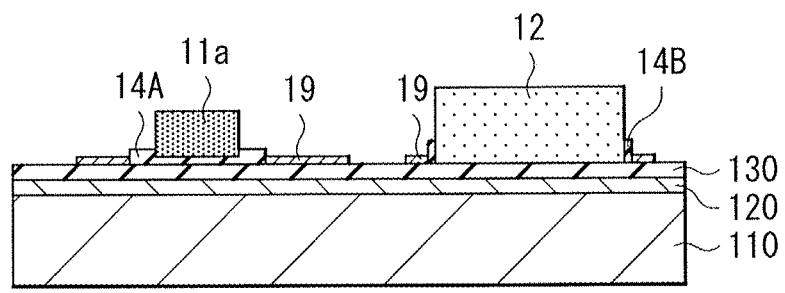
[ FIG. 11E ]
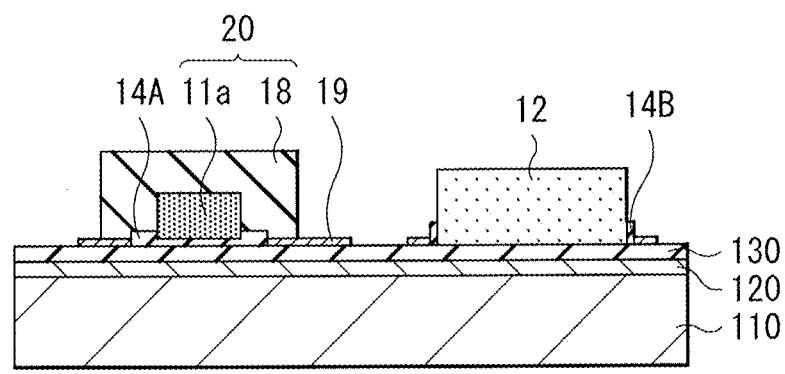
[ FIG. 11F ]
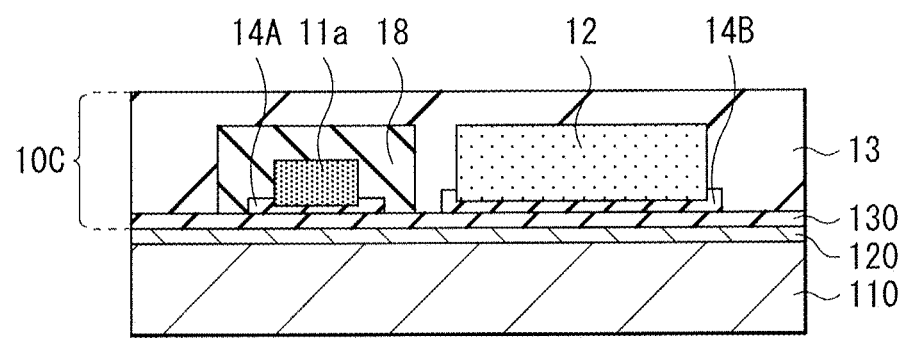

[ FIG. 12A ]
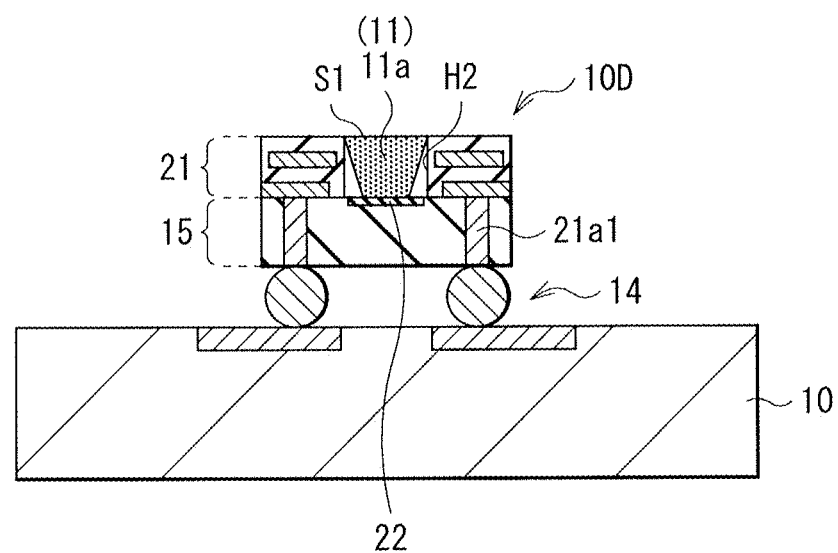
[ FIG. 12B ]
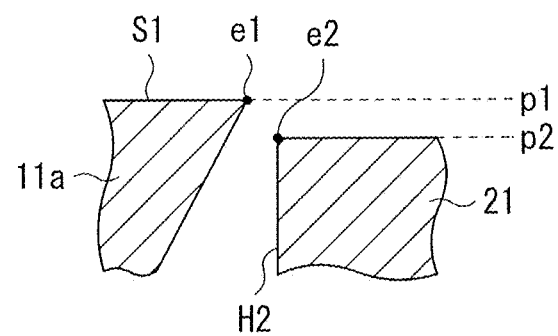

[ FIG. 13A ]
[ FIG. 13B ]
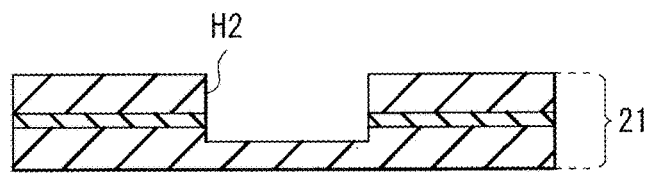
[ FIG. 13C ]
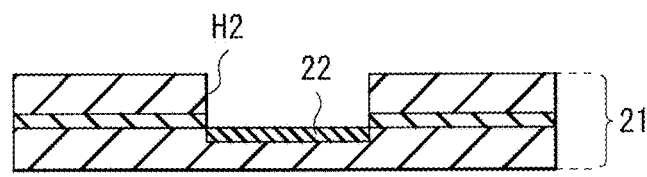
[ FIG. 13D ]
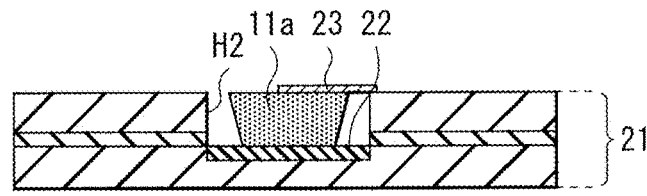
[ FIG. 13E ]
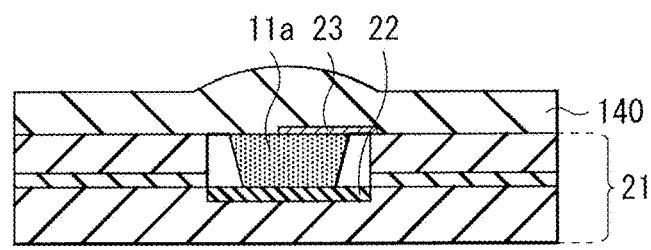
[ FIG. 13F ]
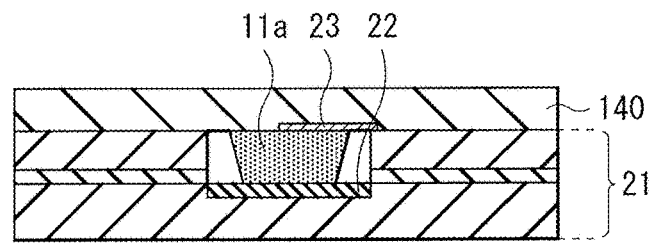

[ FIG. 13G ]
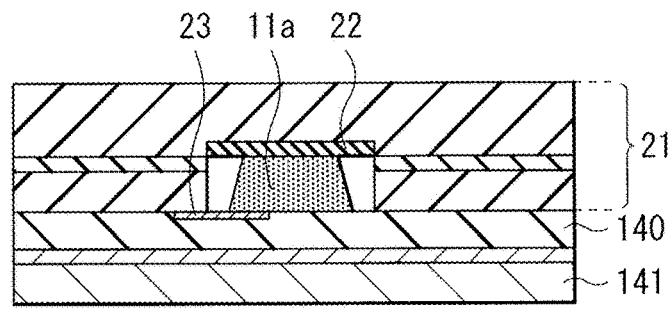
[ FIG. 13H ]
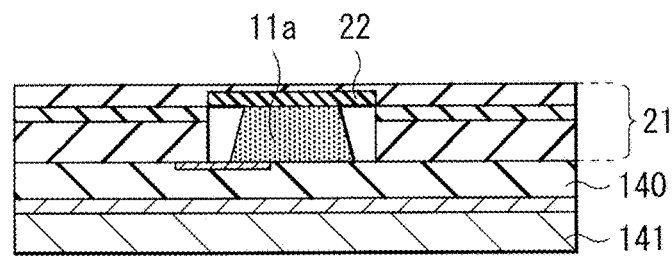
[ FIG. 13I ]
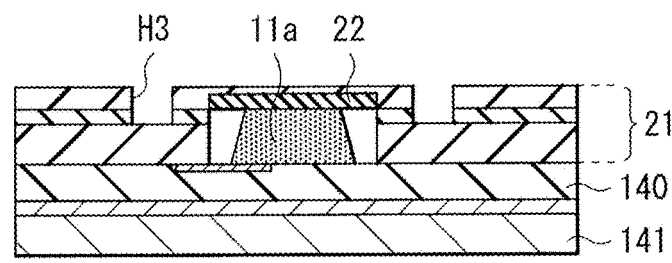
[ FIG. 13J ]
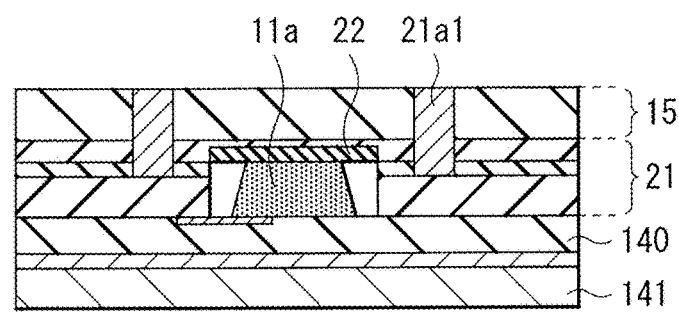
[ FIG. 13K ]
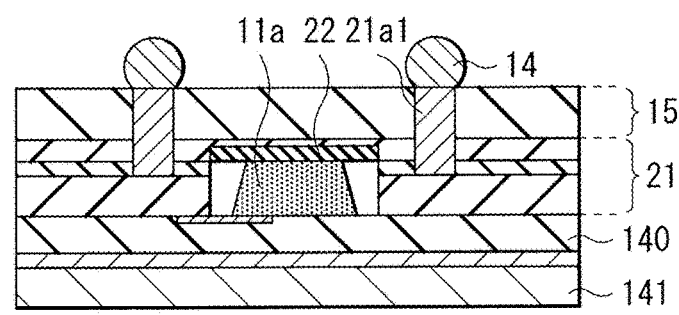

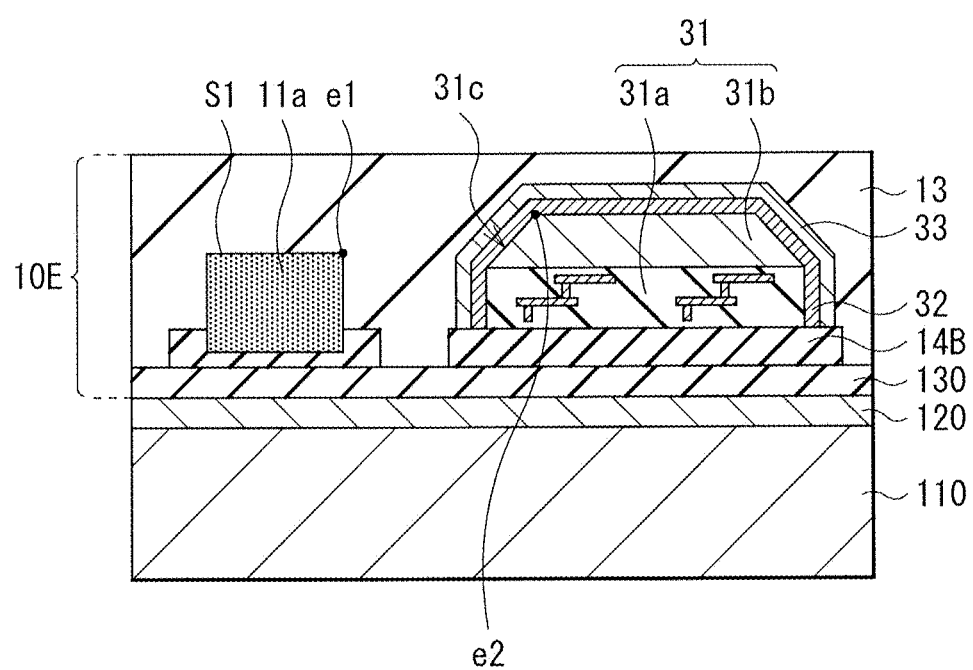
[ FIG. 14 ]

[ FIG. 15A ]
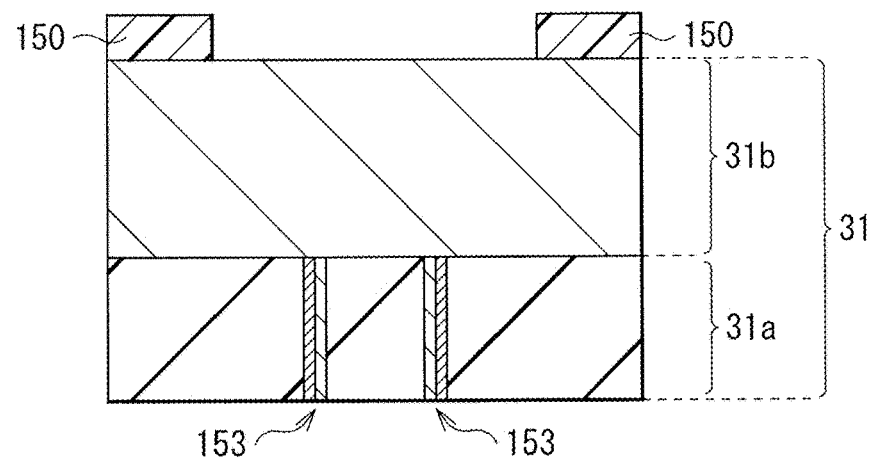
[ FIG. 15B ]
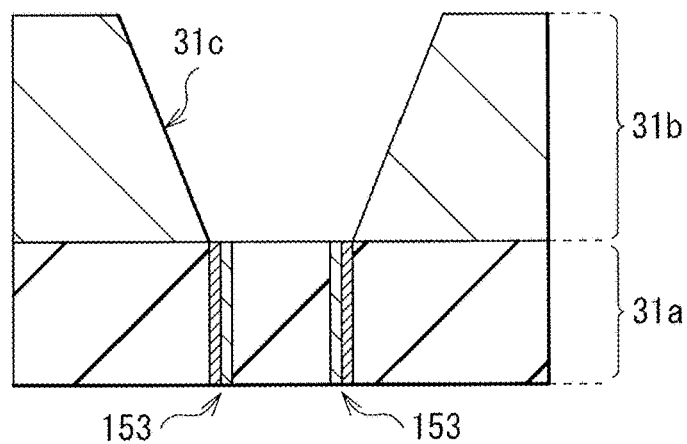
[ FIG. 15C ]
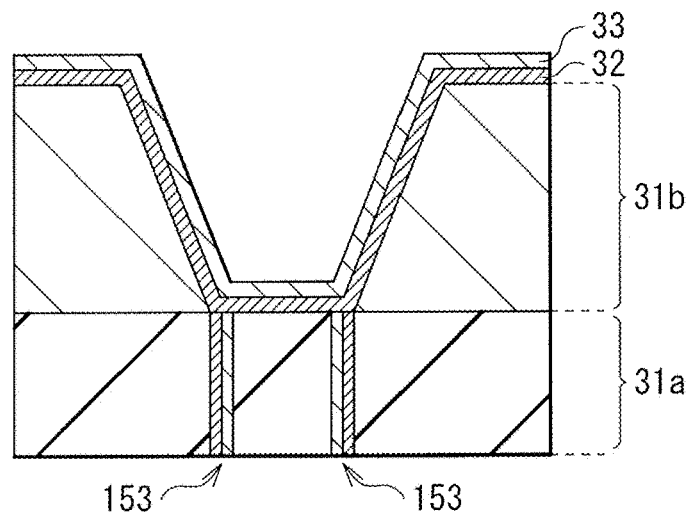

[ FIG. 15D ]
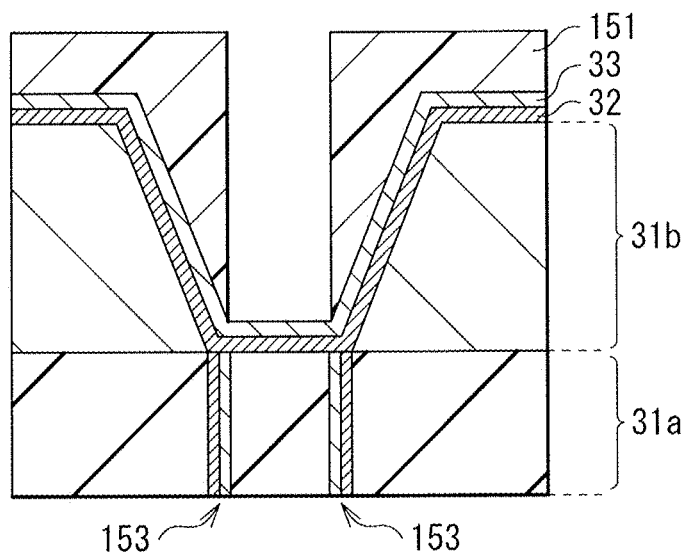
[ FIG. 15E ]
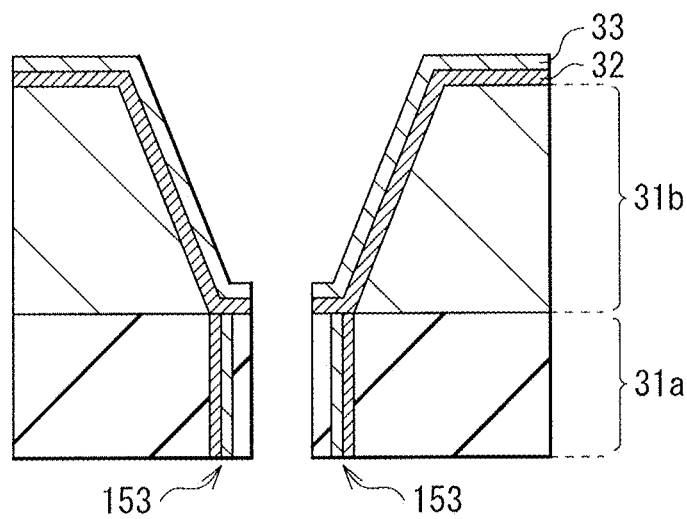

[ FIG. 16 ]
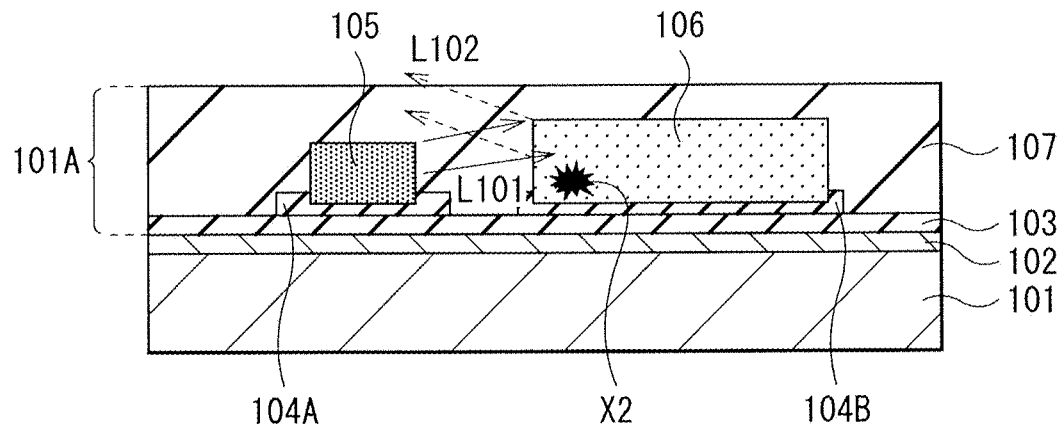
[ FIG. 17 ]
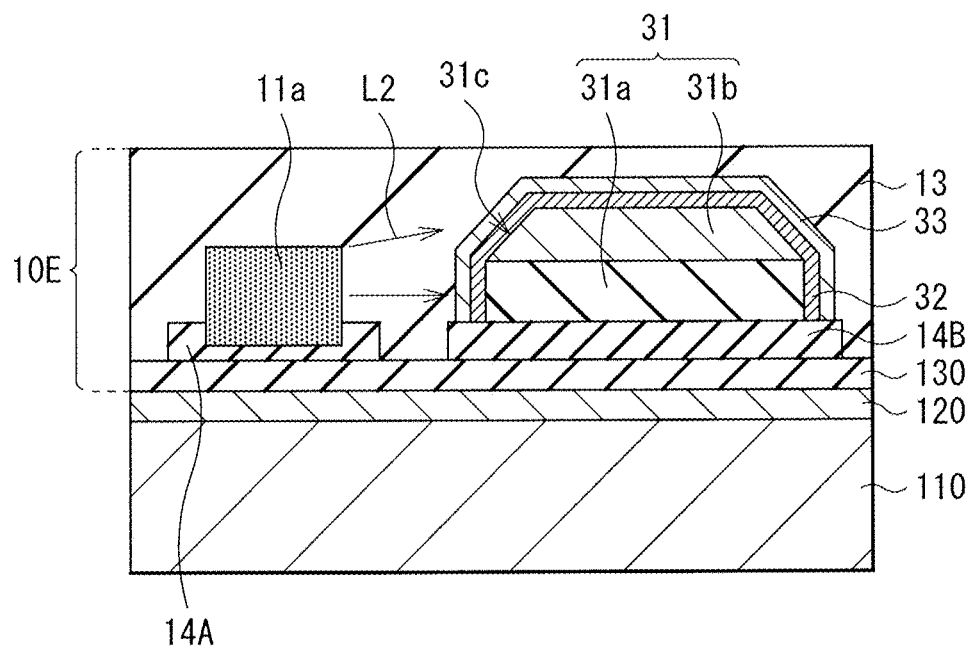

[ FIG. 18 ]
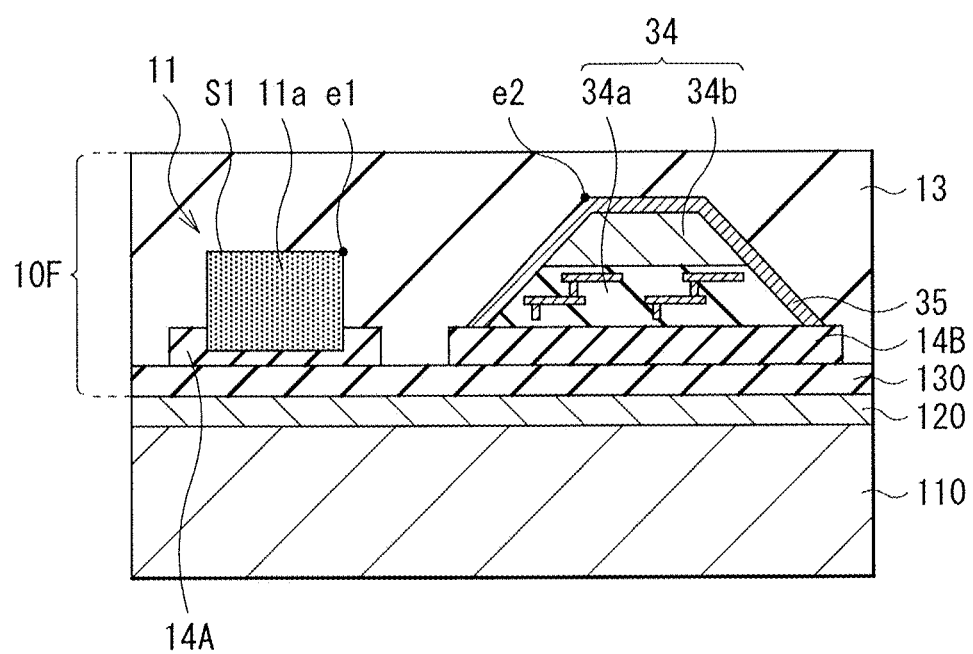

[ FIG. 19A ]
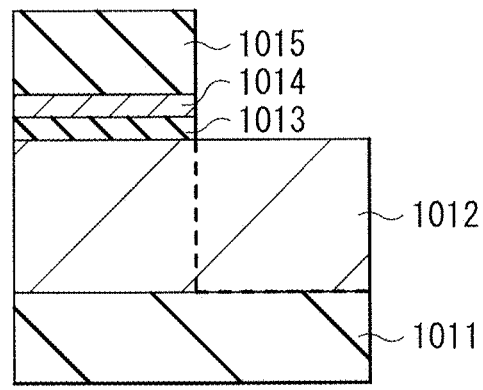
[ FIG. 19B ]
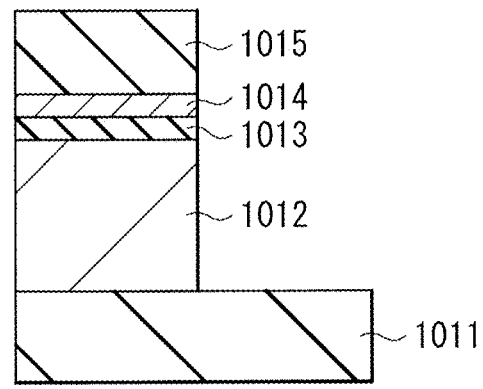
[ FIG. 19C ]
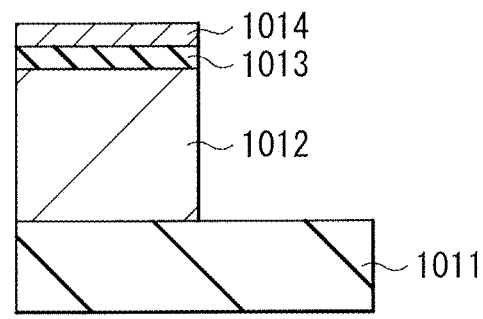

[ FIG. 20A ]
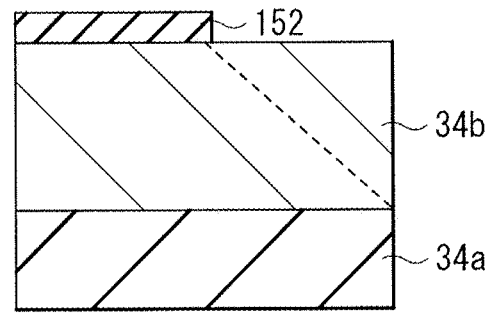
[ FIG. 20B ]
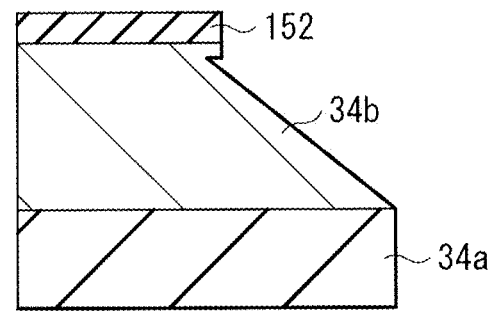
[ FIG. 20C ]
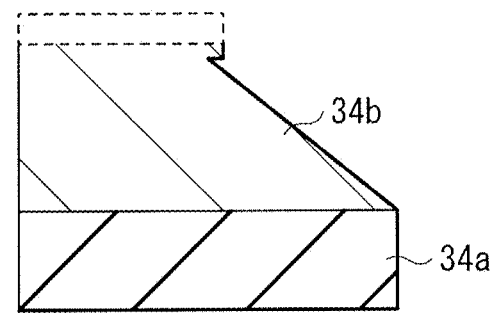

[ FIG. 20D ]
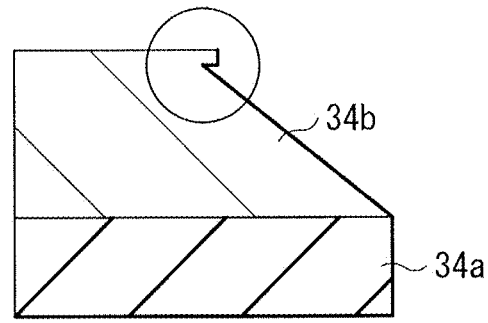
[ FIG. 20E ]
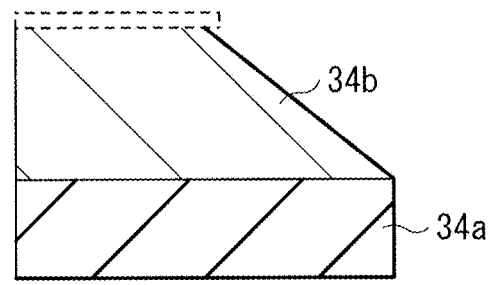
[ FIG. 20F ]
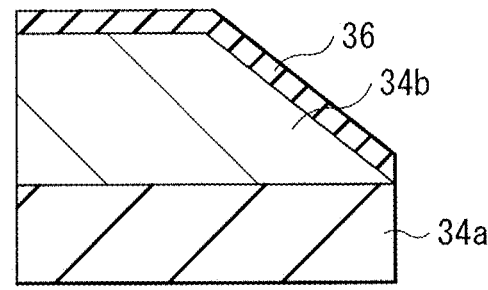
[ FIG. 20G ]
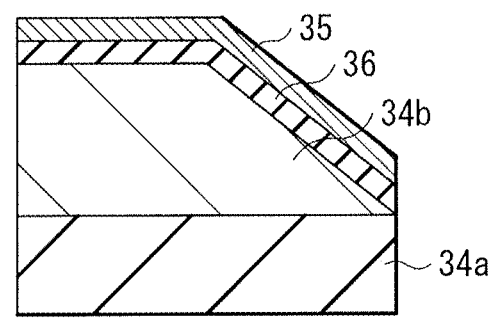

[ FIG. 21 ]
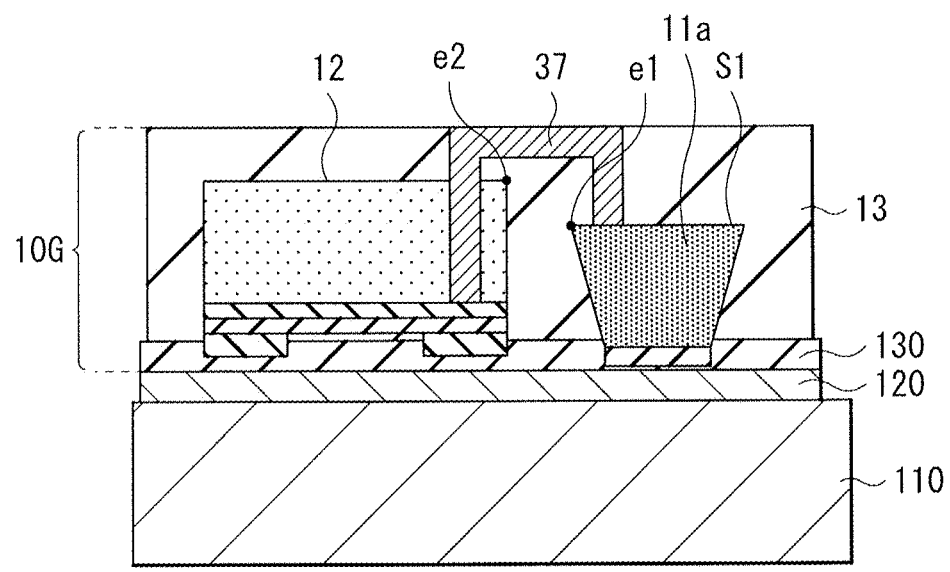
[ FIG. 22A ]
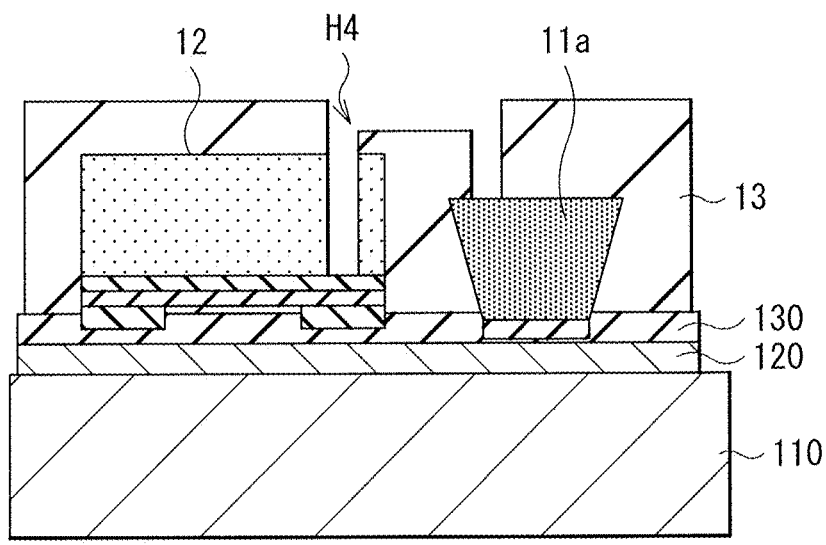

[ FIG. 22B ]
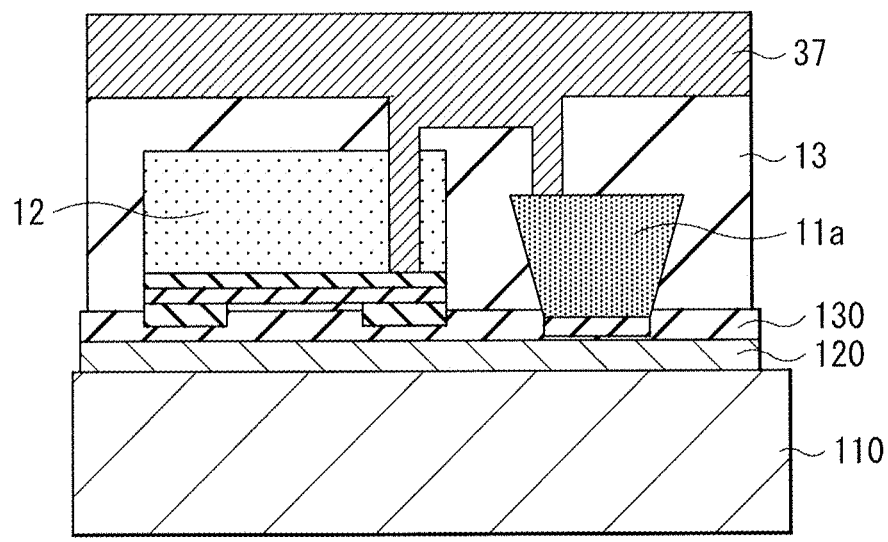
[ FIG. 23 ]
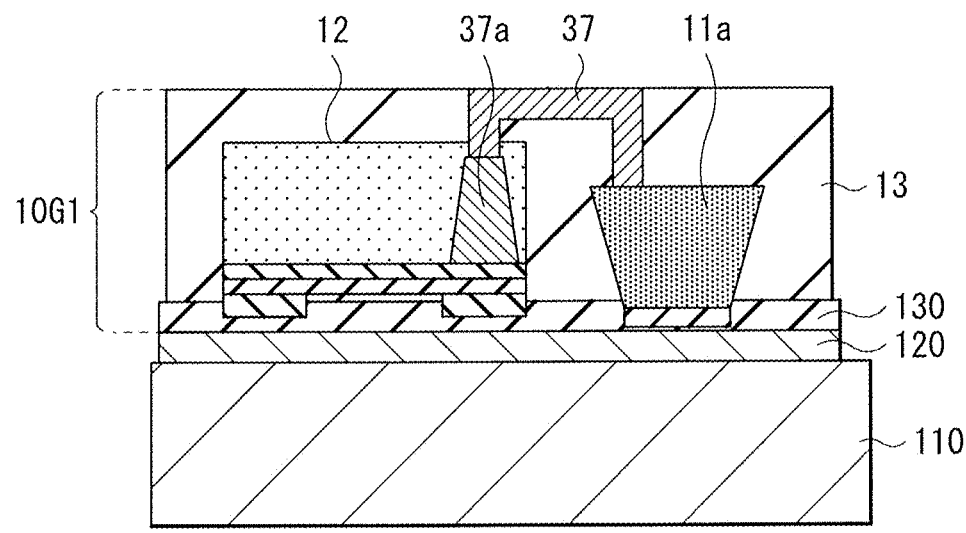

[ FIG. 24 ]
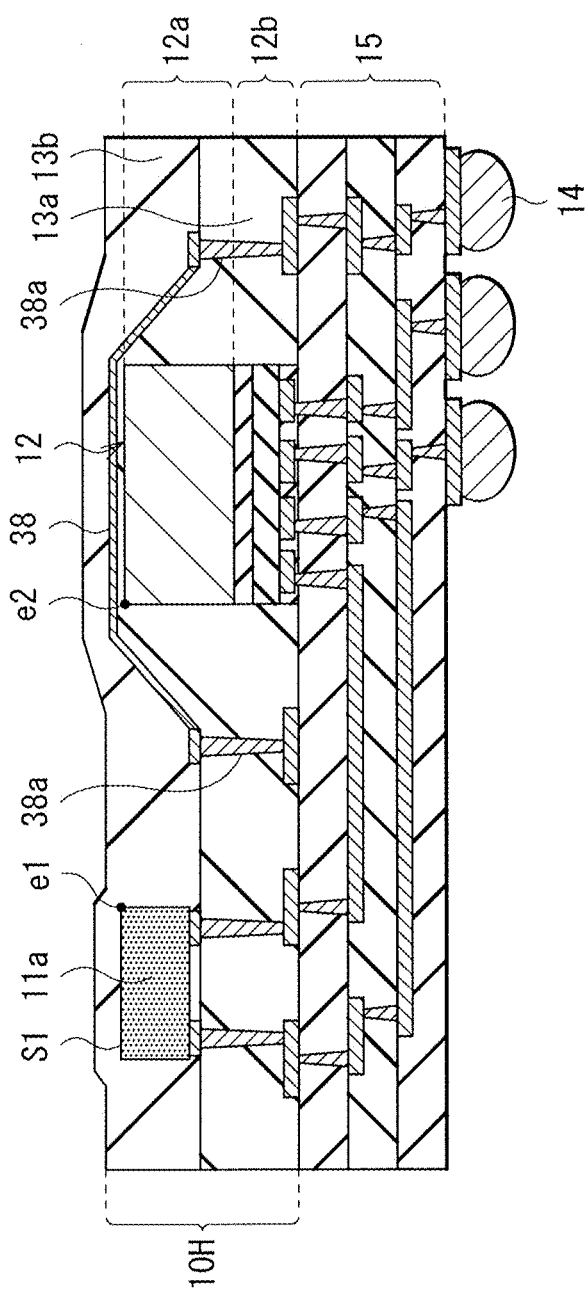

[ FIG. 25 ]
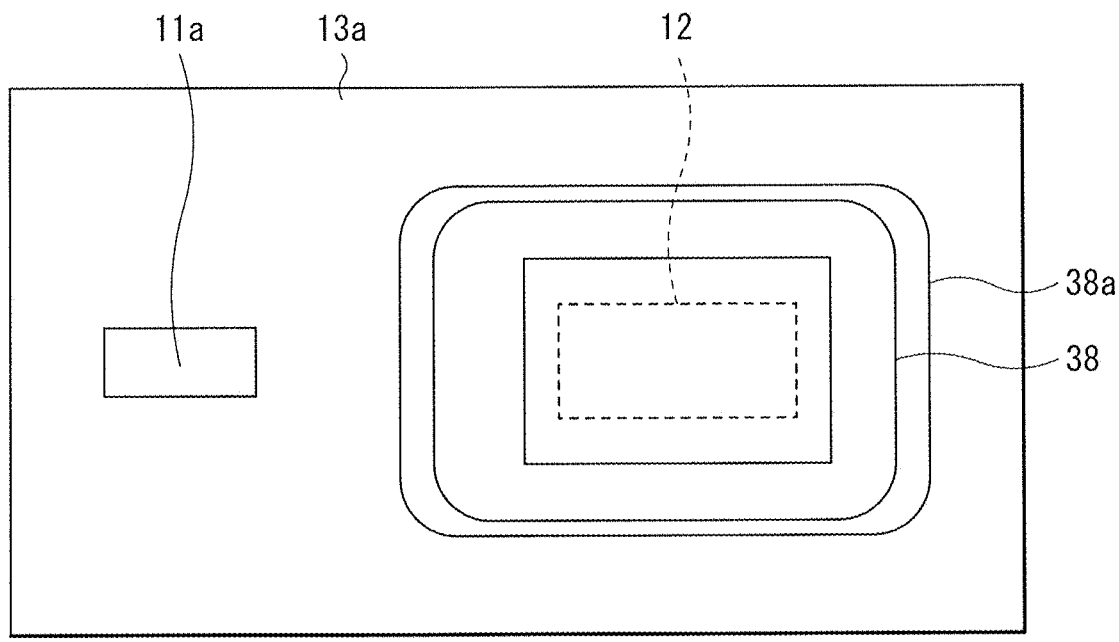
[ FIG. 26 ]
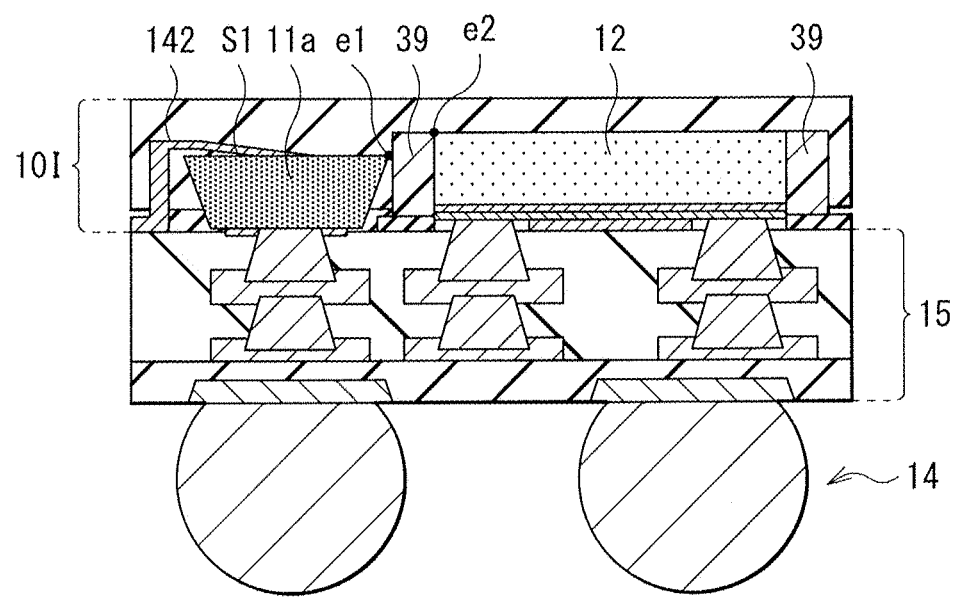

[ FIG. 27A ]
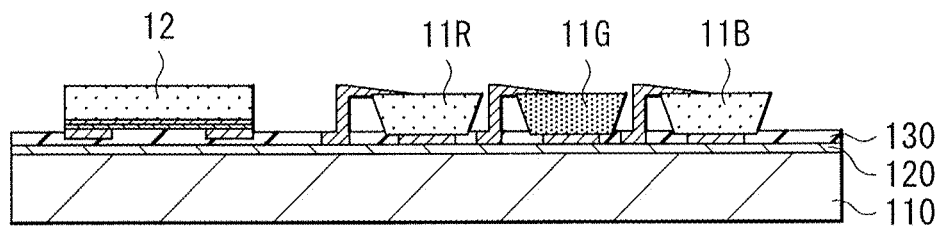
[ FIG. 27B ]
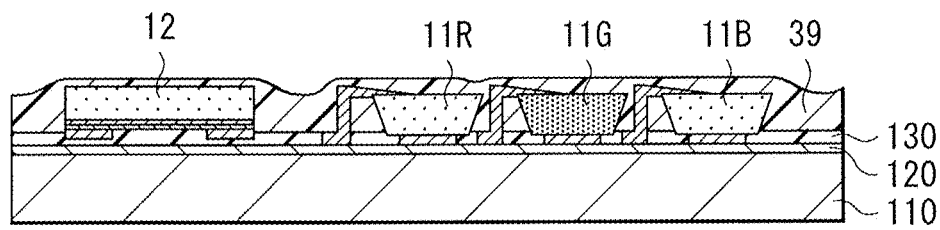
[ FIG. 27C ]
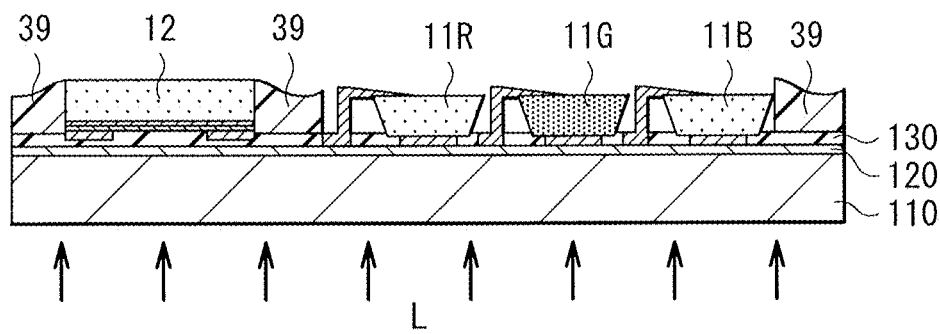
[ FIG. 27D ]
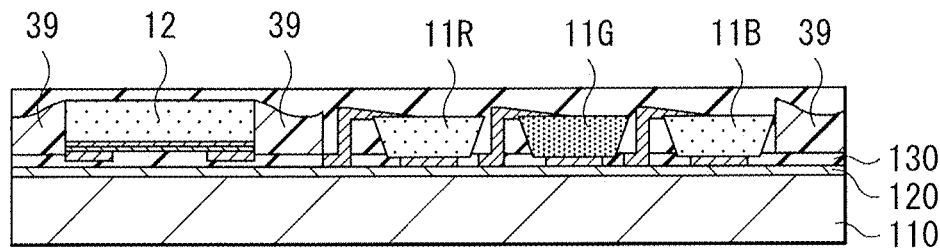

[ FIG. 28 ]
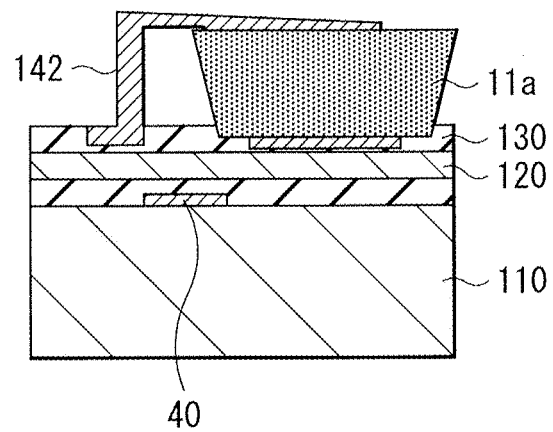
[ FIG. 29 ]
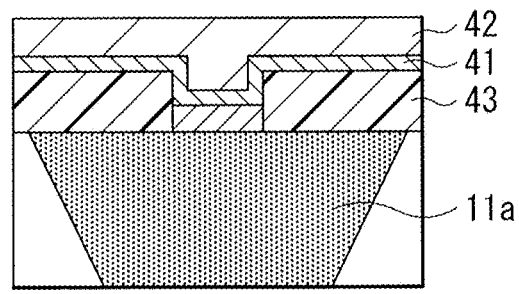
[ FIG. 30 ]
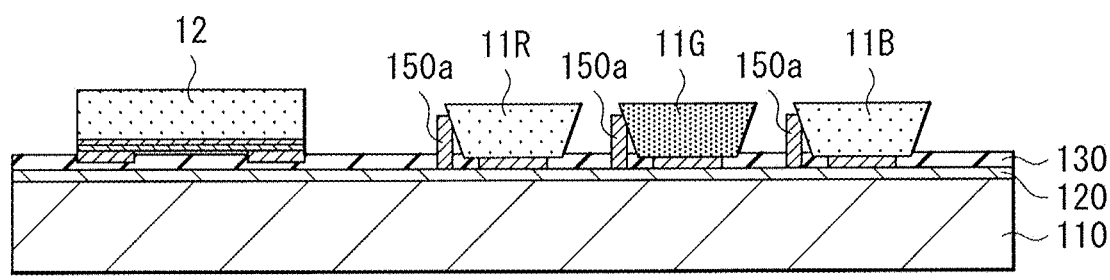

DISPLAY UNIT

This application claims the benefit under 35 U.S.C. § 371 as a U.S. National Stage Entry of International Patent Application Serial No. PCT/JP2015/085171, filed Dec. 16, 2015, entitled "DISPLAY UNIT", which claims priority under 35 U.S.C. § 119(a)-(d) or 35 U.S.C. § 365(b) to Japanese application number 2015-015843, filed Jan. 29, 2015, the entire contents of which are incorporated herein by reference in their entireties.

TECHNICAL FIELD

The disclosure relates to a display unit in which a light-emitting device and a drive device are mounted together in a pixel.

BACKGROUND ART

In recent years, a display unit has been developed, in which a light-emitting device and a driving integrated circuit (IC) that drives such a light-emitting device are mounted together in a single pixel (for example, see PTL 1). In such a display unit, various types of semiconductor devices such as the light-emitting device and the driving IC are formed and encapsulated on a temporary substrate, and thereafter inter-device couplings are made utilizing a transcription technique, a through-silicon via (TSV) technique, or any other equivalent technique. A device substrate thus formed is mounted on a printed circuit board such as an interposer.

CITATION LIST

Patent Literature

[PTL 1] Japanese Unexamined Patent Application Publication No. 2002-182580

SUMMARY OF THE INVENTION

In the display unit as described above, particularly along with the advance of downsizing, an interval between the light-emitting device and the driving IC may be narrowed down, and a portion of light emitted from the light-emitting device is more likely to be vignetted (blocked) by the driving IC. As a result, a viewing angle may be narrowed down, causing an issue of degradation in a display performance.

It is thus desirable to provide a display unit that makes it possible to achieve downsizing while suppressing degradation in the display performance in a device structure including a light-emitting device and a drive device.

A display unit according to one embodiment of the disclosure is provided, on a substrate, with a first wiring layer and a device section. The device section has a plurality of pixels. The device section includes, in each of the pixels, a light-emitting device section and a drive device. The light-emitting device section includes a light-emitting device and a light-emitting surface. The drive device drives the light-emitting device section and is electrically coupled to the light-emitting device section through the first wiring layer. An end of the light-emitting surface of the light-emitting device section is disposed at a position as high as an upper end of the drive device, or at a position higher than the upper end.

In the display unit according to the one embodiment of the disclosure, the first wiring layer and the device section having the plurality of pixels are provided on a substrate, and the device section includes, in each of the pixels, the light-emitting device section that includes the one or the plurality of light-emitting devices, and the drive device that drives the light-emitting device section. In such a manner that the end of the light-emitting surface of the light-emitting device section is disposed at a position as high as the upper end of the drive device, or at a position higher than the upper end, light emitted from the light-emitting device section is less likely to be vignetted at the upper end of the drive device.

According to the display unit of the one embodiment of the disclosure, the first wiring layer, and the device section having the plurality of pixels are provided on a substrate, and the device section includes, in each of the pixels, the light-emitting device section that includes the one or the plurality of light-emitting devices, and the drive device that drives the light-emitting device section and is electrically coupled to the light-emitting device section through the first wiring layer. The end of the light-emitting surface of the light-emitting device section is disposed at a position as high as the upper end of the drive device, or at a position higher than the upper end, which makes it possible to suppress vignetting of light emitted from the light-emitting device section and resultant narrowing of a viewing angle. Accordingly, it is possible to achieve downsizing while suppressing degradation in the display performance in the device structure including the light-emitting device and the drive device.

It is to be noted that the foregoing technical contents are mere examples of the disclosure. The effects according to an embodiment of the disclosure are not limited to those described hereinabove. The disclosure may have effects different from those described above, or may further have other effects in addition to those described above.

BRIEF DESCRIPTION OF DRAWINGS

FIG. 1 is a schematic diagram illustrating an outline configuration of a display unit according to a first embodiment of the disclosure.

FIG. 2 is a schematic diagram illustrating a configuration example of a device section illustrated in FIG. 1.

FIG. 3 is a cross-sectional view of a mounting example of the device section illustrated in FIG. 1 and FIG. 2.

FIG. 4A is a schematic diagram illustrating a method of forming the device section illustrated in FIG. 2 in order of processes.

FIG. 4B is a schematic diagram illustrating a process subsequent to the process illustrated in FIG. 4A.

FIG. 4C is a schematic diagram illustrating a process subsequent to the process illustrated in FIG. 4B.

FIG. 4D is a schematic diagram illustrating a process subsequent to the process illustrated in FIG. 4C.

FIG. 4E is a schematic diagram illustrating a process subsequent to the process illustrated in FIG. 4D.

FIG. 4F is a schematic diagram illustrating a process subsequent to the process illustrated in FIG. 4E.

FIG. 5 is a schematic diagram for describing workings of a device section according to Comparative Example 1.

FIG. 6 is a schematic diagram for describing workings of the device section illustrated in FIG. 2.

FIG. 7 is a schematic diagram illustrating a configuration of a device section according to a second embodiment of the disclosure.

FIG. 8A is a schematic diagram illustrating a method of forming the device section illustrated in FIG. 7 in order of processes.

FIG. 8B is a schematic diagram illustrating a process subsequent to the process illustrated in FIG. 8A.

FIG. 8C is a schematic diagram illustrating a process subsequent to the process illustrated in FIG. 8B.

FIG. 8D is a schematic diagram illustrating a process subsequent to the process illustrated in FIG. 8C.

FIG. 8E is a schematic diagram illustrating a process subsequent to the process illustrated in FIG. 8D.

FIG. 8F is a schematic diagram illustrating a process subsequent to the process illustrated in FIG. 8E.

FIG. 9 is a schematic diagram illustrating a configuration of a device section according to a third embodiment of the disclosure.

FIG. 10 is a schematic diagram illustrating design parameters of a high-refractive-index layer illustrated in FIG. 9.

FIG. 11A is a schematic diagram illustrating a method of forming the device section illustrated in FIG. 9 in order of processes.

FIG. 11B is a schematic diagram illustrating a process subsequent to the process illustrated in FIG. 11A.

FIG. 11C is a schematic diagram illustrating a process subsequent to the process illustrated in FIG. 11B.

FIG. 11D is a schematic diagram illustrating a process subsequent to the process illustrated in FIG. 11C.

FIG. 11E is a schematic diagram illustrating a process subsequent to the process illustrated in FIG. 11D.

FIG. 11F is a schematic diagram illustrating a process subsequent to the process illustrated in FIG. 11E.

FIG. 12A is a schematic diagram illustrating a configuration of a device section according to a fourth embodiment of the disclosure.

FIG. 12B is a schematic diagram enlarging a portion of FIG. 12A.

FIG. 13A is a schematic diagram illustrating a method of forming the device section illustrated in FIG. 12 in order of processes.

FIG. 13B is a schematic diagram illustrating a process subsequent to the process illustrated in FIG. 13A.

FIG. 13C is a schematic diagram illustrating a process subsequent to the process illustrated in FIG. 13B.

FIG. 13D is a schematic diagram illustrating a process subsequent to the process illustrated in FIG. 13C.

FIG. 13E is a schematic diagram illustrating a process subsequent to the process illustrated in FIG. 13D.

FIG. 13F is a schematic diagram illustrating a process subsequent to the process illustrated in FIG. 13E.

FIG. 13G is a schematic diagram illustrating a process subsequent to the process illustrated in FIG. 13F.

FIG. 13H is a schematic diagram illustrating a process subsequent to the process illustrated in FIG. 13G.

FIG. 13I is a schematic diagram illustrating a process subsequent to the process illustrated in FIG. 13H.

FIG. 13J is a schematic diagram illustrating a process subsequent to the process illustrated in FIG. 13I.

FIG. 13K is a schematic diagram illustrating a process subsequent to the process illustrated in FIG. 13J.

FIG. 14 is a schematic diagram illustrating a configuration of a device section according to a fifth embodiment of the disclosure.

FIG. 15A is a schematic diagram illustrating a method of forming the device section illustrated in FIG. 14 in order of processes.

FIG. 15B is a schematic diagram illustrating a process subsequent to the process illustrated in FIG. 15A.

FIG. 15C is a schematic diagram illustrating a process subsequent to the process illustrated in FIG. 15B.

FIG. 15D is a schematic diagram illustrating a process subsequent to the process illustrated in FIG. 15C.

FIG. 15E is a schematic diagram illustrating a process subsequent to the process illustrated in FIG. 15D.

FIG. 16 is a schematic diagram for describing workings of the device section according to Comparative Example 1.

FIG. 17 is a schematic diagram for describing workings of the device section illustrated in FIG. 14.

FIG. 18 is a schematic diagram illustrating a configuration of a device section according to a sixth embodiment of the disclosure.

FIG. 19A is a schematic diagram illustrating a method of forming a device section according to Comparative Example 2 in order of processes.

FIG. 19B is a schematic diagram illustrating a process subsequent to the process illustrated in FIG. 19A.

FIG. 19C is a schematic diagram illustrating a process subsequent to the process illustrated in FIG. 19B.

FIG. 20A is a schematic diagram illustrating a method of forming the device section illustrated in FIG. 18 in order of processes.

FIG. 20B is a schematic diagram illustrating a process subsequent to the process illustrated in FIG. 20A.

FIG. 20C is a schematic diagram illustrating a process subsequent to the process illustrated in FIG. 20B.

FIG. 20D is a schematic diagram illustrating a process subsequent to the process illustrated in FIG. 20C.

FIG. 20E is a schematic diagram illustrating a process subsequent to the process illustrated in FIG. 20D.

FIG. 20F is a schematic diagram illustrating a process subsequent to the process illustrated in FIG. 20E.

FIG. 20G is a schematic diagram illustrating a process subsequent to the process illustrated in FIG. 20F.

FIG. 21 is a schematic diagram illustrating a configuration of a device section according to a seventh embodiment of the disclosure.

FIG. 22A is a schematic diagram illustrating a method of forming the device section illustrated in FIG. 21 in order of processes.

FIG. 22B is a schematic diagram illustrating a process subsequent to the process illustrated in FIG. 22A.

FIG. 23 is a schematic diagram illustrating a configuration of a device section according to Modification Example 1.

FIG. 24 is a schematic diagram illustrating a configuration of a device section according to an eighth embodiment of the disclosure.

FIG. 25 is a planar schematic diagram illustrating a key part configuration of the device section illustrated in FIG. 24.

FIG. 26 is a schematic diagram illustrating a configuration of a device section according to a ninth embodiment of the disclosure.

FIG. 27A is a schematic diagram illustrating a method of forming the device section illustrated in FIG. 26 in order of processes.

FIG. 27B is a schematic diagram illustrating a process subsequent to the process illustrated in FIG. 27A.

FIG. 27C is a schematic diagram illustrating a process subsequent to the process illustrated in FIG. 27B.

FIG. 27D is a schematic diagram illustrating a process subsequent to the process illustrated in FIG. 27C.

FIG. 28 is a schematic diagram illustrating a configuration of a device section according to Modification Example 2-1.

FIG. 29 is a schematic diagram illustrating a configuration of a device section according to Modification Example 2-2.

FIG. 30 is a schematic diagram illustrating a configuration of a device section according to Modification Example 2-3.

MODES FOR CARRYING OUT THE INVENTION

Hereinafter, some embodiments of the disclosure are described in detail with reference to the drawings. It is to be noted that the description is given in the following order.
1. First Embodiment (an example of a display unit in which an insulating film is formed under a light-emitting device, and a light-emitting surface is provided at a position higher than a drive device)
2. Second Embodiment (an example of a display unit in which a drive device is formed in a recessed portion, and a light-emitting surface is provided at a position higher than the drive device)
3. Third Embodiment (an example of a display unit in which a high-refractive-index layer that covers a light-emitting device is provided, and a light-emitting surface is provided at a position higher than a drive device)
4. Fourth Embodiment (an example of a case where a light-emitting device is formed to be embedded into a drive device)
5. Fifth Embodiment (an example of a case where a drive device has a tapered shape)
6. Sixth Embodiment (an example of a case where a drive device has a cross-sectional shape of a trapezoidal form)
7. Seventh Embodiment (an example of a case where a connection wiring line between a light-emitting device and a drive device also serves as a light-shielding layer)
8. Modification Example 1 (another example of a connection wiring line between a light-emitting device and a drive device)
9. Eighth Embodiment (an example of a case where a seed layer that is superposed on a drive device also serves as a light-shielding layer)
10. Ninth Embodiment (an example of a case where a light-shielding resin layer is formed to be embedded between a light-emitting device and a drive device)
11. Modification Examples 2-1 to 2-3 (other examples of the light-shielding layer)

1. First Embodiment

[Configuration]

FIG. 1 illustrates an overall configuration of a display unit (display unit 1) according to a first embodiment of the disclosure. FIG. 2 schematically illustrates an example of a configuration of a device section 10A. It is to be noted that FIG. 2 illustrates a state where the device section 10A is formed on a temporary substrate (second substrate 110) prior to detachment (prior to formation of a rewiring layer 15) instead of a first substrate 10 with an adhesion layer (detachment layer 120) interposed in between. FIG. 3 is a cross-sectional view of a configuration example in which the device section 10A is mounted on the first substrate 10.

The display unit 1 is a light-emitting unit in which a light-emitting device section 11 that includes one or a plurality of light-emitting devices 11R, 11G, and 11B (referred to as a light-emitting device 11a in a case where it is not necessary for them to be specifically distinguished from one another), and a drive device 12 that drives the light-emitting device section 11 are mounted together in a single pixel. The device section 10A that includes the light-emitting device 11a and the drive device 12 is mounted on the first substrate 10 with the rewiring layer 15 and a junction 14 interposed in between. In the display unit 1, the device section 10A may be formed on, for example, an unillustrated temporary substrate, and thereafter the rewiring layer 15 is formed utilizing a transcription technique, a TSV technique, or any other equivalent technique to make inter-device wiring line connections.

The first substrate 10 may include a printed circuit board such as an interposer, for example. The device section 10A is detached from the temporary substrate, and is mounted on the first substrate 10 after the rewiring layer 15 is formed utilizing the TSV technique, or any other equivalent technique. The first substrate 10 corresponds to a specific example of a "substrate" in one embodiment of the disclosure.

The light-emitting device section 11 includes, for example, the light-emitting devices 11R, 11G, and 11B that emit color light beams of red (R), green (G), and blue (B), respectively. Each of these light-emitting devices 11R, 11G, and 11B may be configured by, for example, a light-emitting diode (LED), and is disposed alongside inside the device section 10A. The light-emitting devices 11R, 11G, and 11B may be formed in width ranging, for example, from several micrometers to several hundred micrometers, and are disposed at narrow and small intervals.

The drive device 12 is a driving IC, and may include a silicon (Si) layer (Si layer 12a) including, for example, an IC chip, and a multi-layer wiring layer (wiring layer 12b) that is formed with use of, for example, a back-end of line (BEOL) technique, as illustrated in FIG. 3. The drive device 12 is disposed alongside the light-emitting device section 11 inside the device section 10A. An interval between the drive device 12 and the light-emitting device 11a is also narrow and small.

In the device section 10A, the light-emitting device section 11 and the drive device 12 are sealed by a sealing layer 13. The sealing layer 13 is configured by an inorganic insulating film such as a silicon oxide film and a silicon nitride film, for example, and may be a single-layer film, or may be a laminated film. Further, the light-emitting device 11a and the drive device 12 are bonded with underlayers (such as an insulating film 15s, a transparent insulating film 130, and a wiring layer 16) via adhesion layers 14A and 14B.

The junction 14 serves to solder the rewiring layer 15 and the first substrate 10. The junction 14 may be made of an alloy containing, for example, tin (Sn), copper (Cu), silver (Ag), or any other metallic element.

The rewiring layer 15 is a multi-layer wiring layer that includes, for example, a wiring line for electrical coupling between each of the light-emitting devices 11 a in the light-emitting device section 11 and the drive device 12, a wiring line for electrical coupling between the light-emitting device 11a and the junction 14, a wiring line for electrical coupling between the drive device 12 and the junction 14, or any other wiring line. After formation of the device section 10A, the rewiring layer 15 is formed adjacent to the device section 10A through a process such as a detachment process. The rewiring layer 15 corresponds to a specific example of a "first wiring layer" in one embodiment of the disclosure.

In the present embodiment, as illustrated in FIG. 2, an end e1 of a light-emitting surface of the light-emitting device section 11 is disposed at a position as high as an upper end e2 of the drive device 12, or at a position higher than the upper end e2, in the device section 10A as described above. Here, a top surface of the light-emitting device 11a that configures the light-emitting device section 11 (for example, a top surface of a light-emitting diode chip) serves as a light-emitting surface S1, and the end e1 of the light-emitting surface S1 is disposed at a position higher than the upper end e2 of the drive device 12 (a height p1 of the end e1 >a height p2 of the end e2).

More specifically, in the light-emitting device section 11, an insulating film 15s (a first insulating film) is formed under the light-emitting device 11a. In other words, the insulating film 15s is formed on side of the second substrate 110 (first substrate 10) of the light-emitting device 11a. A total of a thickness of the insulating film 15s and a thickness of the light-emitting device 11a is equal to or greater than a thickness of the drive device 12. The insulating film 15s is made of a transparent resin such as a silicone resin, an acrylic resin, a polyimide resin, and an epoxy resin, for example. Alternatively, the insulating film 15s may be made of an inorganic transparent material such as a silicon oxide film, a silicon nitride film, or a silicon oxynitride film, for example. Setting of the thickness of the insulating film 15s enables the height p2 of the light-emitting surface S1 to be adjusted.

[Manufacturing Method]

It is possible to form the device section 10A of the display unit 1 in the following manner, for example. FIGS. 4A to 4F are each a schematic diagram illustrating a method of forming the device section 10A in order of processes.

First, as illustrated in FIG. 4A, the detachment layer 120 and the transparent insulating film 130 (a second insulating film) are formed in this order on the second substrate 110. Thereafter, as illustrated in FIG. 4B, the insulating film 15s is formed at a selective region on the transparent insulating film 130 through etching with use of, for example, a photolithographic technique. At this time, processing is performed to ensure that a side surface of the insulating film 15s has a tapered shape 15a. Next, as illustrated in FIG. 4C, the wiring layer 16 is formed. The tapered shape 15a of the insulating film 15s makes it possible to suppress disconnection of the wiring layer 16. It is to be noted that the wiring layer 16 is omitted in FIG. 2 for simplicity.

Thereafter, as illustrated in FIG. 4D, an adhesion layer 14A is formed at a region on the insulating film 15s, and an adhesion layer 14B is formed at a selective region on the transparent insulating film 130. Next, as illustrated in FIG. 4E, the light-emitting device 11a and the drive device 12 are bonded (transcribed) on the adhesion layers 14A and 14B, respectively. Finally, as illustrated in FIG. 4F, the sealing layer 13 is formed to cover the light-emitting device section 11 (light-emitting device 11a) and the drive device 12. In such a manner, the device section 10A is formed. The following processes are not specifically illustrated; however, the second substrate 110 and a counter substrate are bonded together with the device section 10A interposed in between, and thereafter the second substrate 110 is detached from the transparent insulating film 130 with use of the detachment layer 120. The rewiring layer 15 and the junction 14 are formed on side of the transparent insulating film 130 of the device section 10A, and are soldered on the first substrate 10. The above-described processes make it possible to manufacture the display unit 1 illustrated in FIG. 1.

[Workings and Effects]

In the display unit 1 of the present embodiment, an image voltage is supplied to each pixel from an unillustrated drive circuit on the basis of an image signal that is inputted from the outside. This causes pixels to be display-driven, thus allowing images to be displayed.

Here, in the device section 10A of the display unit 1, the light-emitting device section 11 that includes the light-emitting device 11a and the drive device 12 that drives the light-emitting device section 11 are disposed together in a single pixel. Accordingly, an interval between the light-emitting device 11a and the drive device 12 is relatively narrow. Particularly, along with the advance of downsizing, the light-emitting device 11a and the drive device 12 are disposed within a close range from several micrometers to several hundred micrometers.

FIG. 5 illustrates a structure of a device section 101A according to Comparative Example 1. It is to be noted that, in this comparative example, FIG. 5 illustrates a state where the device section 101A is formed on a second substrate 101 with a detachment layer 102 interposed in between. In the device section 101A, a light-emitting device 105 is disposed on a transparent insulating film 103 with an adhesion layer 104A interposed in between, and a drive device 106 is disposed with an adhesion layer 104B interposed in between. Here, the light-emitting device 105 is typically smaller than the drive device 106 in size. Therefore, in the device section 101A of Comparative Example 1, a light-emitting surface s100 is disposed at a lower position than an upper end e102 of the drive device 106. In such a case, a portion of light (light in the range of X) that is emitted from the light-emitting surface S100 is vignetted (blocked) at the upper end e102 of the drive device 106. As a result, in a case where the device section 101A is mounted on a printed circuit board, or any other wiring board, a portion of light that is emitted from the light-emitting device 105 is blocked by the drive device 106, causing a viewing angle to be narrowed down.

In contrast, in the present embodiment, the end e1 of the light-emitting surface S1 of the light-emitting device section 11 is disposed at a position as high as the upper end e2 of the drive device 12, or at a position higher than the upper end e2, as illustrated in FIG. 6. More specifically, the insulating film 15s is provided on substrate side of the light-emitting device 11a. As a result, light emitted from the light-emitting device section 11 (light-emitting device 11a) is less likely to be blocked by the drive device 12, which allows for suppression of narrowing of the viewing angle. This makes it possible to achieve downsizing while suppressing degradation in a display performance in the device structure including the light-emitting device and the drive device.

Hereinafter, description is provided on any of device sections according to other embodiments of the disclosure. It is to be noted that any component essentially same as those in the above-described first embodiment are denoted with the same reference numerals, and the related descriptions are omitted as appropriate.

Second Embodiment

[Configuration]

FIG. 7 schematically illustrates a configuration of a device section (device section 10B) according to a second embodiment of the disclosure. It is to be noted that FIG. 7 illustrates a state where the device section 10B is formed on the second substrate 110 with the detachment layer 120 interposed in between. In the device section 10B of the present embodiment, the light-emitting device section 11 (light-emitting device 11a) and the drive device 12 are mounted together in a single pixel, as with the device section 10A of the above-described first embodiment. Further, the device section 10B is mounted on the first substrate 10 with the rewiring layer 15 as well as the junction 14 interposed in between, although not illustrated in FIG. 7. In addition, also in the device section 10B, the light-emitting device section 11 includes the light-emitting device 11a, and the light-emitting device 11a and the drive device 12 are covered by the sealing layer 13.

Further, also in the present embodiment, the end e1 of the light-emitting surface S1 of the light-emitting device section 11 is disposed at a position as high as the upper end e2 of the drive device 12, or at a position higher than the upper end e2. In the example illustrated in FIG. 7, the height p1 of the end e1 of the light-emitting surface S1 is greater than the height p2 of the upper end e2 of the drive device 12.

However, the present embodiment is different from the above-described first embodiment in that the drive device 12 is disposed at a lower position than the light-emitting device 11a. More specifically, in the present embodiment, an opening (or a recessed portion) is formed at a selective region of the transparent insulating film 130, and the drive device 12 is bonded to this opening portion with the adhesion layer 14B interposed in between. The light-emitting device 11a is bonded to the selective region on the transparent insulating film 130 with the adhesion layer 14A interposed in between.

[Method of Forming Device Section 10B]

It is possible to form the device section 10B in the following manner, for example. FIGS. 8A to 8F are each a schematic diagram illustrating a method of forming the device section 10B in order of processes.

First, as illustrated in FIG. 8A, the detachment layer 120 and the transparent insulating film 130 are formed in this order on the second substrate 110. Thereafter, as illustrated in FIG. 8B, an opening H1 is formed at a selective region on the transparent insulating film 130 through etching with use of, for example, the photolithographic technique. At this time, processing is performed to ensure that a side surface of the opening H1 has a tapered shape H1a. Next, as illustrated in FIG. 8C, a wiring layer 17 is formed. The tapered shape H1a of the opening H1 makes it possible to suppress disconnection of the wiring layer 17. It is to be noted that the wiring layer 17 is omitted in FIG. 7 for simplicity.

Thereafter, as illustrated in FIG. 8D, the adhesion layer 14A is formed at a selective region on the transparent insulating film 130, and the adhesion layer 14B is formed inside the opening H1. Next, as illustrated in FIG. 8E, the light-emitting device 11a and the drive device 12 are bonded on the adhesion layers 14A and 14B, respectively. Finally, as illustrated in FIG. 8F, the sealing layer 13 is formed to cover the light-emitting device section 11 (light-emitting device 11a) and the drive device 12. In such a manner, the device section 10B is formed. The following processes are not specifically illustrated; however, the second substrate 110 and a counter substrate are bonded together with the device section 10B interposed in between, and thereafter the second substrate 110 is detached from the transparent insulating film 130 with use of the detachment layer 120. The rewiring layer 15 and the junction 14 are formed on side of the transparent insulating film 130 of the device section 10B, and are soldered on the first substrate 10, thus making it possible to manufacture the display unit as illustrated in FIG. 1.

[Effects]

In the present embodiment as well, the end e1 of the light-emitting surface S1 of the light-emitting device section 11 is disposed at a position as high as the upper end e2 of the drive device 12, or at a position higher than the upper end e2, in the device section 10B in which the light-emitting device section 11 and the drive device 12 are mounted together in a single pixel. More specifically, the opening (or the recessed portion) is formed at a selective region of the transparent insulating film 130, and the drive device 12 is provided at this opening portion. As a result, light emitted from the light-emitting device section 11 (light-emitting device 11a) is less likely to be blocked by the drive device 12, which allows for suppression of narrowing of the viewing angle. This makes it possible to achieve the effects similar to those in the above-described first embodiment.

Third Embodiment

[Configuration]

FIG. 9 schematically illustrates a configuration of a device section (device section 10C) according to a third embodiment of the disclosure. It is to be noted that FIG. 9 illustrates a state where the device section 10C is formed on the second substrate 110 with the detachment layer 120 interposed in between. In the device section 10C of the present embodiment, a light-emitting device section (light-emitting device section 20) and the drive device 12 are mounted together in a single pixel, as with the device section 10A of the above-described first embodiment. Further, the device section 10C is mounted on the first substrate 10 with the rewiring layer 15 as well as the junction 14 interposed in between, although not illustrated in FIG. 9. In addition, also in the device section 10C, the light-emitting device section 20 includes the light-emitting device 11a, and the light-emitting device section 20 and the drive device 12 are covered by the sealing layer 13.

Further, also in the present embodiment, an end (end e3) of a light-emitting surface (light-emitting surface S2) of the light-emitting device section 11 is disposed at a position as high as the upper end e2 of the drive device 12, or at a position higher than the upper end e2.

However, the present embodiment is different from the above-described first embodiment in that the light-emitting device section 20 includes the light-emitting device 11a, and a high-refractive-index layer 18 that covers the light-emitting device 11a. Further, a top surface of the high-refractive-index layer 18 forms the light-emitting surface S2, and the end e3 of the light-emitting surface S2 is disposed at a height that is equal to or greater than the upper end e2 of the drive device 12.

The high-refractive-index layer 18 is formed to cover the top surface and the side surface of the light-emitting device 11a. The high-refractive-index layer 18 is made of a material having the refractive index that is higher than that of the sealing layer 13. Examples of the constituent material of the high-refractive-index layer 18 may include a resin containing one or both of sulfur (S) and phosphorous (P), such as an acrylic resin, an epoxy resin, and a polyimide resin; and a resin containing nanoparticles of $TiO_2$, for example.

FIG. 10 is a schematic diagram for describing design parameters of the high-refractive-index layer 18. A maximum value of an emission angle $\beta$ of light emitted from the end e3 of the light-emitting surface S2 of the high-refractive-index layer 18 may be preferably 90 degrees. In other words, it is preferable for the light that enters an interface between the sealing layer 13 and the high-refractive-index layer 18 at an incident angle $\alpha$ and is emitted at the emission angle $\beta$ ($\beta$=90 degrees) to travel along a direction in parallel with the top surface of the drive device 12.

A material and thickness of the high-refractive-index layer 18 may be preferably set up to satisfy Conditional Expression (A) given below, for example. In the expression, $n0$ is a refractive index of the sealing layer 13; $n1$ is a refractive index of the high-refractive-index layer 18; L1 is thickness of the high-refractive-index layer 18 facing the side surface of the light-emitting device 11a; and H1 is thickness of the high-refractive-index layer 18 facing the light-emitting surface (top surface) of the light-emitting device 11a. Further, as a constraint condition, magnitude relationships of L1<L2 and $H_{LED}$>$H_{IC}$ are established.

$$n0/n1 < L1/(H1^2+L1^2)^{1/2} \qquad (A)$$

[Method of Forming Device Section 10C]

It is possible to form the device section 10C in the following manner, for example. FIGS. 11A to 11F are each a schematic diagram illustrating a method of forming the device section 10C in order of processes.

First, as illustrated in FIG. 11A, the detachment layer 120 and the transparent insulating film 130 are formed in this order on the second substrate 110. Thereafter, as illustrated in FIG. 11B, a pattern of a wiring layer 19 is formed on the transparent insulating film 130. Next, as illustrated in FIG. 11C, each of the adhesion layers 14A and 14B is formed at a selective region on the transparent insulating film 130. It is to be noted that the wiring layer 19 is omitted in FIG. 10 for simplicity.

Thereafter, as illustrated in FIG. 11D, the light-emitting device 11a and the drive device 12 are bonded on the adhesion layers 14A and 14B, respectively. Next, as illustrated in FIG. 11E, the high-refractive-index layer 18 is formed to cover the light-emitting device 11a. In such a manner, the light-emitting device section 20 and the drive device 12 are formed. Finally, as illustrated in FIG. 11F, the sealing layer 13 is formed to cover the light-emitting device section 20 (light-emitting device 11a and the high-refractive-index layer 18) and the drive device 12. In such a manner, the device section 10C is formed. The following processes are not specifically illustrated; however, the second substrate 110 and a counter substrate are bonded together with the device section 10C interposed in between, and thereafter the second substrate 110 is detached from the transparent insulating film 130 with use of the detachment layer 120. The rewiring layer 15 and the junction 14 are formed on side of the transparent insulating film 130 of the device section 10C, and are soldered on the first substrate 10, thus making it possible to manufacture the display unit as illustrated in FIG. 1.

[Effects]

In the present embodiment as well, the end e3 of the light-emitting surface S2 of the light-emitting device section 20 is disposed at a position as high as the upper end e2 of the drive device 12, or at a position higher than the upper end e2, in the device section 10C in which the light-emitting device section 20 and the drive device 12 are mounted together in a single pixel. More specifically, in the light-emitting device section 20, the high-refractive-index layer 18 is formed to cover the light-emitting device 11a, and the end e3 of the top surface (light-emitting surface S2) of the high-refractive-index layer 18 is disposed at a height that is equal to or greater than the upper end e2 of the drive device 12. As a result, light emitted from the light-emitting device section 20 is less likely to be blocked by the drive device 12, which allows for suppression of narrowing of the viewing angle. This makes it possible to achieve the effects similar to those in the above-described first embodiment.

Fourth Embodiment

[Configuration]

FIG. 12A schematically illustrates a configuration of a device section (device section 10D) according to a fourth embodiment of the disclosure. FIG. 12B is a schematic diagram enlarging a portion of the device section 10D. In the device section 10D of the present embodiment, the light-emitting device section 11 (light-emitting device 11a) and a drive device (drive device 21) are mounted together in a single pixel, as with the device section 10A of the above-described first embodiment. Further, the device section 10D is mounted on the first substrate 10 with the rewiring layer 15 as well as the junction 14 interposed in between.

Further, also in the present embodiment, as illustrated in FIG. 12B, the end e1 of the light-emitting surface S1 of the light-emitting device section 11 is disposed at a position as high as the upper end e2 of the drive device 21, or at a position higher than the upper end e2.

However, the device section 10D of the present embodiment is different from the above-described first embodiment in that the light-emitting device 11a is formed to be embedded into a portion of the drive device 21. More specifically, the drive device 21 has a recessed portion H2 (second recessed portion) at a selective region, and the light-emitting device 11a is formed inside the recessed portion H2.

Further, as an underlayer of the light-emitting device 11a, a SiN film 22 (third insulating film) is formed on the bottom surface of the recessed portion H2. Adjusting a thickness of the SiN film 22 enables a height of the light-emitting surface Si to be adjusted.

[Method of Forming Device Section 10D]

It is possible to form the device section 10D in the following manner, for example. FIGS. 13A to 13K are each a schematic diagram illustrating a method of forming the device section 10D in order of processes.

First, as illustrated in FIG. 13A, the drive device 21 made of a material such as a silicon chip is formed. Thereafter, as illustrated in FIG. 13B, the recessed portion H2 is formed on the drive device 21. Next, as illustrated in FIG. 13C, the SiN film 22 is formed to have a predetermined thickness on the bottom surface of the recessed portion H2. Subsequently, as illustrated in FIG. 13D, the light-emitting device 11a is transcribed to form a wiring layer 23. It is to be noted that the wiring layer 23 is omitted in FIG. 12A for simplicity. Next, as illustrated in FIG. 13E, an interlayer insulating film 140 is formed to cover the drive device 21 and the light-emitting device 11a, and thereafter the interlayer insulating film 140 is planarized, as illustrated in FIG. 13F. In such a manner, the device section 10D is formed, in which the light-emitting device 11a is embedded into the drive device 21.

Next, as illustrated in FIG. 13G, a counter substrate 141 is bonded on side of the interlayer insulating film 140 of the drive device 21 with an adhesion layer interposed in between. Thereafter, as illustrated in FIG. 13H, a S1 substrate of the drive device 21 is thinned. Subsequently, as illustrated in FIG. 13I, a through-hole H3 is formed utilizing the TSV technique. Afterward, as illustrated in FIG. 13J, a wiring layer 21a1 is formed to embed the through-hole H3. Finally, as illustrated in FIG. 13K, soldering (the junction 14) is formed on the wiring layer 21a1. In such a manner, the device structure illustrated in FIG. 12A is formed.

[Effects]

In the present embodiment as well, the end e1 of the light-emitting surface S1 of the light-emitting device section 11 is disposed at a position as high as the upper end e2 of the drive device 21, or at a position higher than the upper end e2, in the device section 10D in which the light-emitting device section 11 and the drive device 12 are mounted together in a single pixel. More specifically, the light-emitting device 11a is embedded into the recessed portion H2 that is formed on the drive device 21, and a height of the light-emitting surface S1 is adjustable by a thickness of the SiN film 22. As a result, light emitted from the light-emitting device section 11 (light-emitting device 11a) is less likely to be blocked by the drive device 12, which allows for suppression of narrowing of the viewing angle. This makes it possible to achieve the effects similar to those in the above-described first embodiment.

Fifth Embodiment

[Configuration]

FIG. 14 schematically illustrates a configuration of a device section (device section 10E) according to a fifth embodiment of the disclosure. It is to be noted that FIG. 14 illustrates a state where the device section 10E is formed on the second substrate 110 with the detachment layer 120 interposed in between. In the device section 10E of the present embodiment, the light-emitting device section (light-emitting device 11a) and a drive device (drive device 31) are mounted together in a single pixel, as with the device section 10A of the above-described first embodiment. Further, the device section 10E is mounted on the first substrate 10 with the rewiring layer 15 as well as the junction 14 interposed in between, although not illustrated in FIG. 14. In addition, also in the device section 10E, the light-emitting device 11a and the drive device 31 are covered with the sealing layer 13.

However, in the device section 10E of the present embodiment, unlike the above-described first embodiment, the drive device 31 has a tapered shape 31c. Further, the drive device 31 is covered with a light-shielding film 32 and an antireflective film 33. In the drive device 31, a wiring layer 31a that is formed utilizing the BEOL technique, and a Si layer 31b that includes a silicon chip are laminated, and the Si layer 31b of those two layers has the tapered shape 31c.

[Method of Forming Device Section 10E]

It is possible to form the device section 10E as described above in the following manner, for example. FIGS. 15A to 15E are each a schematic diagram illustrating a method of forming the device section 10E in order of processes.

First, as illustrated in FIG. 15A, a photoresist film 150 is formed in a predetermined pattern on the drive device 31 that includes the wiring layer 31a and the Si layer 31b. It is to be noted that a guard ring layer 153 (laminated film of a light-shielding film and an antireflective film) is formed beforehand in the wiring layer 31a. Thereafter, as illustrated in FIG. 15B, the Si layer 31b is processed through etching. This process forms the tapered shape 31c. Subsequently, as illustrated in FIG. 15C, the light-shielding film 32 and the antireflective film 33 are formed to cover the formed tapered shape 31c.

Thereafter, as illustrated in FIG. 15D, a photoresist film 151 is formed in a predetermined pattern on the antireflective film 33. Next, as illustrated in FIG. 15E, a portion of each of the light-shielding film 32 and the antireflective film 33 and a portion of the wiring layer 31a are removed through etching with use of the photoresist film 151. This allows, as illustrated in FIG. 14, the drive device 31 as well as the light-shielding film 32 and the antireflective film 33 to be formed. The following processes are not specifically illustrated; however, the sealing layer 13 is formed to cover the light-emitting device 11a and the drive device 31. In such a manner, the device section 10E is formed. Subsequently, the second substrate 110 and a counter substrate are bonded together with the device section 10E interposed in between, and thereafter the second substrate 110 is detached from the transparent insulating film 130 with use of the detachment layer 120. Afterward, the rewiring layer 15 and the junction 14 are formed on side of the transparent insulating film 130 of the device section 10E, and are soldered on the first substrate 10. The above-described processes make it possible to manufacture the display unit as illustrated in FIG. 1.

[Effects]

FIG. 16 illustrates a structure of the device section 101A according to Comparative Example 1. It is to be noted that, in this comparative example, FIG. 16 illustrates a state where the device section 101A is formed on the second substrate 101 with the detachment layer 102 interposed in between. In the device section 101A, the light-emitting device 105 is disposed on the transparent insulating film 103 with the adhesion layer 104A interposed in between, and the drive device 106 is disposed with the adhesion layer 104B interposed in between. As described previously, in the device section 101A of Comparative Example 1, the light-emitting surface s100 is disposed at a lower position than the upper end e102 of the drive device 106. Consequently, in Comparative Example 1, a viewing angle may be narrowed down due to the above-described vignetting of light. In addition, light L101 that leaks out of the light-emitting device 105 may enter the drive device 106 (X2), which may have an influence on the characteristics of components such as transistors that configure the IC. As a result, in a case where the device section 101A is mounted on a printed circuit board, or any other wiring board, a portion of leakage light from the light-emitting device 105 may enter the drive device 106, causing the transistor characteristics to deteriorate. Further, in the event of occurrence of light reflection on the side surface of the drive device 106, such light reflection may cause the display quality to degrade in some cases.

In contrast, in the present embodiment, the drive device 31 has the tapered shape 31c, as illustrated in FIG. 17. As a result, light emitted from the light-emitting device 11a is less likely to be blocked by the drive device 31, which allows for suppression of narrowing of the viewing angle. Further, the device section 10E has the light-shielding film 32 and the antireflective film 33 that cover the drive device 31, which makes it possible to suppress entering of light into the drive device 31, and light reflection on the side surface of the drive device 31. This makes it possible to achieve the effects similar to those in the above-described first embodiment, and to suppress characteristic deterioration in the drive device 31 as well as degradation in the display quality due to light reflection.

It is to be noted that, in the above-described fifth embodiment, the use of the tapered shape 31c allows vignetting of light to be suppressed; however, any of the above-described first to third embodiments may be further adopted in such a manner that the end e1 of the light-emitting surface S1 of the light-emitting device section 11 is disposed at a position as high as the upper end e2 of the drive device 12, or at a position higher than the upper end e2. As a result, light emitted from the light-emitting device section 11 (light-emitting device 11a) is less likely to be blocked by the drive device 12, which allows for suppression of narrowing of the viewing angle. This makes it possible to achieve downsizing while suppressing degradation in a display performance in the device structure including the light-emitting device and the drive device.

Sixth Embodiment

[Configuration]

FIG. 18 schematically illustrates a configuration of a device section (device section 10F) according to a sixth embodiment of the disclosure. It is to be noted that FIG. 18 illustrates a state where the device section 10F is formed on the second substrate 110 with the detachment layer 120 interposed in between. In the device section 10F of the present embodiment, the light-emitting device section (light-emitting device 11a) and a drive device (drive device 34) are mounted together in a single pixel, as with the device section 10A of the above-described first embodiment. Further, the device section 10F is mounted on the first substrate 10 with the rewiring layer 15 as well as the junction 14 interposed in between, although not illustrated in FIG. 18. In addition, also in the device section 10F, the light-emitting device 11a and the drive device 34 are covered with the sealing layer 13.

Further, in the device section 10F of the present embodiment, the drive device 34 has a tapered shape 34c, as with the above-described fifth embodiment. In addition, the drive device 34 is covered with a light-shielding film 35. In the drive device 34, a wiring layer 34a that is formed utilizing the BEOL technique, and a Si layer 34b that includes a silicon chip are laminated. Each of the wiring layer 34a and the Si layer 34b has the tapered shape 34c, and a cross-sectional shape of the drive device 34 is trapezoidal. As described above, both of the wiring layer 34a and the Si layer 34b may have the tapered shape. Alternatively, the antireflective film 33 is not provided, and only the light-shielding film 35 may be provided to cover the drive device 34. However, as with the above-described fifth embodiment, it may be preferable to form the antireflective film 33, because it becomes possible to suppress degradation in the display quality.

[Effects]

In the present embodiment as well, the drive device 34 has the tapered shape 34c, as with the above-described fifth embodiment. As a result, light emitted from the light-emitting device 11a is less likely to be blocked by the drive device 34, which allows for suppression of narrowing of the viewing angle. Further, the device section 10F has the light-shielding film 35 that covers the drive device 34, which makes it possible to suppress entering of light into the drive device 34. This makes it possible to achieve the effects similar to those in the above-described first embodiment, and to suppress characteristic deterioration in the drive device 31. It is to be noted that an antireflective film may be further provided, as with the fifth embodiment.

It is to be noted that, in the above-described sixth embodiment, the use of the tapered shape 34c allows vignetting of light to be suppressed; however, any of the above-described first to third embodiments may be further adopted in such a manner that the end e1 of the light-emitting surface S1 of the light-emitting device section 11 is disposed at a position as high as the upper end e2 of the drive device 12, or at a position higher than the upper end e2. As a result, light emitted from the light-emitting device section 11 (light-emitting device 11a) is less likely to be blocked by the drive device 12, which allows for suppression of narrowing of the viewing angle. This makes it possible to achieve downsizing while suppressing degradation in a display performance in the device structure including the light-emitting device and the drive device.

[Other Methods of Forming Tapered Shapes]

It is also possible to form tapered shapes of the device sections 10E and 10F in the above-described respective fifth and sixth embodiments in the following manner, for example. FIGS. 19A to 19C are each a schematic diagram illustrating a method of forming the device section according to Comparative Example 2 in order of processes. FIGS. 20A to 20G are each a schematic diagram illustrating a method of forming the tapered shape in order of processes. It is to be noted that the description is here provided by citing the device section 10E illustrated in FIG. 14 as an example.

First, in Comparative Example 2, a portion of a Si layer 1012 of a wiring layer 1011 that is formed utilizing the BEOL technique and the Si layer 1012 is removed selectively through etching (for example, dry etching) with use of a photoresist film 1015, as illustrated in FIGS. 19A and 19B. Such a method forms the tapered shape 31c. Thereafter, as illustrated in FIG. 19C, the photoresist film 1015 is removed. It is to be noted that a light-shielding film (Ti) 1014 is formed on the Si layer 1012 with a transparent insulating film 1013 interposed in between. Such a Si processing in Comparative Example 2 uses a dry process, and therefore the coverage of the side surface of the Si after processing may be poor, which has room for improvement of the light-shielding property.

Accordingly, a tapered shape may be formed for a Si layer 34b, as illustrated in FIGS. 20A to 20G. In other words, at the beginning, a wet treatment with use of, for example, an alkali-based etchant is performed using a mask 152 that is made of, for example, SiN, as illustrated in FIGS. 20A and 20B. Thereafter, as illustrated in FIG. 20C, the wet treatment with use of, for example, acid-based etchant is performed to remove the mask 152. Next, as illustrated in FIGS. 20D and 20E, the wet treatment with use of, for example, the acid-based etchant is performed to selectively remove the upside (eave portion) of the Si layer 34b. Subsequently, as illustrated in FIGS. 20F and 20G, a transparent insulating film 36 and the light-shielding film 35 are formed in this order to cover the Si layer 34b. In such a manner, the Si layer 34b has a tapered shape, leading to better coverage property of the light-shielding film 35 as compared with the above-described comparative example 2. This makes it possible to achieve the adequate light-shielding property.

Seventh Embodiment

[Configuration]

FIG. 21 schematically illustrates a configuration of a device section (device section 10G) according to a seventh embodiment of the disclosure. It is to be noted that FIG. 21 illustrates a state where the device section 10G is formed on the second substrate 110 with the detachment layer 120 interposed in between. In the device section 10G of the present embodiment, the light-emitting device section (light-emitting device 11a) and the drive device 12 are mounted together in a single pixel, as with the device section 10A of the above-described first embodiment. Further, the device section 10G is mounted on the first substrate 10 with the rewiring layer 15 as well as the junction 14 interposed in between, although not illustrated in FIG. 21. In addition, also in the device section 10G, the light-emitting device 11a and the drive device 12 are covered with the sealing layer 13.

However, in the device section 10G of the present embodiment, a wiring line (connection wiring line 37) for electrical coupling between the light-emitting device 11a and the drive device 12 is embedded into the sealing layer 13, unlike the above-described first embodiment. In this case, a wiring line for electrical coupling between the light-emitting device 11a and the drive device 12 is not formed in the rewiring layer 15.

[Method of Forming Device Section 10G]

It is possible to form the device section 10G as described above in the following manner, for example. FIGS. 22A and 22B are each a schematic diagram illustrating a method of forming the device section 10G in order of processes.

First, as illustrated in FIG. 22A, the sealing layer 13 is formed to cover the light-emitting device 11a and the drive device 12, and thereafter a connection hole H4 is formed in the sealing layer 13. Subsequently, as illustrated in FIG. 22B, the connection wiring line 37 is formed to embed the connection hole H4. Finally, by removing a portion of front surface side of the formed connection wiring line 37, it is possible to form the device section 10G illustrated in FIG. 21.

The following processes are not specifically illustrated; however, the second substrate 110 and a counter substrate are bonded together with the device section 10G interposed in between, and thereafter the second substrate 110 is detached from the transparent insulating film 130 with use of the detachment layer 120. Afterward, the rewiring layer 15 and the junction 14 are formed on side of the transparent insulating film 130 of the device section 10G, and are soldered on the first substrate 10. The above-described processes make it possible to manufacture the display unit as illustrated in FIG. 1.

[Effects]

In the present embodiment, the connection wiring line 37 for electrical coupling between the light-emitting device 11a and the drive device 12 is embedded into the sealing layer 13 to thereby function as a light-shielding film (also serve as the light-shielding film), thus allowing for suppression of entering of light into the drive device 12. This makes it possible to achieve the effects similar to those in the above-described fifth embodiment.

It is to be noted that, in the above-described seventh embodiment, any of the above-described first to third embodiments may be further adopted in such a manner that the end e1 of the light-emitting surface S1 of the light-emitting device section 11 is disposed at a position as high as the upper end e2 of the drive device 12, or at a position higher than the upper end e2. As a result, light emitted from the light-emitting device section 11 (light-emitting device 11a) is less likely to be blocked by the drive device 12, which allows for suppression of narrowing of the viewing angle. Such a configuration makes it possible to achieve the effects similar to those in the above-described first embodiment.

Modification Example 1

FIG. 23 schematically illustrates a configuration of a device section (device section 10G1) according to a modification example of the above-described seventh embodiment. In the device section 10G1 of the present modification example, the electrical coupling between the light-emitting device 11a and the drive device 12 is assured using the connection wiring line 37 and a through via 37a that are based on the TSV technique. In such a manner, it is also possible to make wiring connections using the TSV technique.

Eighth Embodiment

[Configuration]

FIG. 24 schematically illustrates a configuration of a device section (device section 10H) according to an eighth embodiment of the disclosure. FIG. 25 illustrates a planar configuration of a key part of the device section 10G. In the device section 10H of the present embodiment, the light-emitting device section (light-emitting device 11a) and the drive device 12 are mounted together in a single pixel, as with the device section 10A of the above-described first embodiment. Further, the device section 10H is mounted on the first substrate 10 (not illustrated in FIG. 24) with the rewiring layer 15 as well as the junction 14 interposed in between.

However, in the device section 10H of the present embodiment, unlike the above-described first embodiment, a seed layer 38 is formed in a state of being superposed on the drive device 12, and is configured to be interposed between the light-emitting device 11a and the drive device 12 to also serve as a light-shielding layer. The seed layer 38 is an underlayer to be used in forming a metallic wiring line such as a copper (Cu) wiring line, for example, through a plating treatment. A portion of a seed layer (a portion corresponding to the seed layer 38) to be typically removed after plating formation is left as it is by covering it with a material such as a photoresist that is utilized as the light-shielding layer. Further, at an outer circumferential portion of the seed layer 38, support posts 38a are formed using other wiring lines. The seed layer 38 and support posts 38a are formed to surround the side surface and top surface of the drive device 12 as a whole.

[Effects]

In the present embodiment, the seed layer 38 and the support posts 38a are formed to surround the drive device 12. As a result, the seed layer 38 and the support posts 38a function as a light-shielding film (also serve as the light-shielding film), allowing for suppression of entering of light into the drive device 12. This makes it possible to achieve the effects similar to those in the above-described fifth embodiment.

It is to be noted that, in the above-described eighth embodiment, any of the above-described first to third embodiments may be further adopted in such a manner that the end e1 of the light-emitting surface S1 of the light-emitting device section 11 is disposed at a position as high as the upper end e2 of the drive device 12, or at a position higher than the upper end e2. As a result, light emitted from the light-emitting device section (light-emitting device 11a) is less likely to be blocked by the drive device 12, which allows for suppression of narrowing of the viewing angle. Such a configuration makes it possible to achieve the effects similar to those in the above-described first embodiment.

Ninth Embodiment

[Configuration]

FIG. 26 schematically illustrates a configuration of a device section (device section 10I) according to a ninth embodiment of the disclosure. In the device section 10I of the present embodiment, the light-emitting device section (light-emitting device 11a) and the drive device 12 are mounted together in a single pixel, as with the device section 10A of the above-described first embodiment. Further, the device section 10I is mounted on the first substrate 10 (not illustrated in FIG. 26) with the rewiring layer 15 as well as the junction 14 interposed in between. In addition, FIG. 26 also illustrates a lead-out wiring line 142 that is coupled to an electrode of the light-emitting device 11a.

However, the device section 10I of the present embodiment has a light-shielding resin layer 39 that is formed to be embedded between the light-emitting device 11a and the drive device 12, unlike the above-described first embodiment. The light-shielding resin layer 39 is made of a photosensitive resin to be used for black matrix, for example. Preferably, the light-shielding resin layer 39 may be further formed to be embedded also between the light-emitting devices 11a. This is because a structure having both functions of a light-shielding layer and a planarizing layer is achievable.

[Method of Forming Device Section 10I]

It is possible to form the device section 10I as described above in the following manner, for example. FIGS. 27A to 27D are each a schematic diagram illustrating a method of forming the device section 10I in order of processes. It is to be noted that each of FIGS. 27A to 27D illustrates three light-emitting devices 11R, 11G, and 11B as the light-emitting device 11a.

First, as illustrated in FIG. 27A, the light-emitting device 11a (light-emitting devices 11R, 11G, and 11B) and the drive device 12 are bonded (transcribed to be formed) onto the transparent insulating film 130. Thereafter, as illustrated in FIG. 27B, the light-shielding resin layer 39 is formed over a whole surface of the second substrate 110. As the light-shielding resin layer 39, for example, a negative-type photoresist is usable. Next, as illustrated in FIG. 27C, by performing a treatment such as exposure and development from the backside of the second substrate 110, the light-shielding resin layer 39 remains between the light-emitting device 11a and the drive device 12, and between pixels, for example. It is to be noted that a positive-type photoresist may be used as the light-shielding resin layer 39, and the exposure may be performed from the front side. In such a manner, it is possible to form the device section 10I as illustrated in FIG. 26.

[Effects]

In the present embodiment, the light-shielding resin layer 39 is formed to embed an interval between the light-emitting device 11a and the drive device 12, which allows for suppression of entering of light from the light-emitting device 11a into the drive device 12. This makes it possible to achieve the effects similar to those in the above-described fifth embodiment. Further, the light-shielding resin layer 39 is formed between devices to also serve as a planarizing layer, thereby allowing for suppression of occurrence of an air gap (a void) in subsequent processes.

It is to be noted that, in the above-described ninth embodiment, any of the above-described first to third embodiments may be further adopted in such a manner that the end e1 of the light-emitting surface S1 of the light-emitting device section 11 is disposed at a position as high as the upper end e2 of the drive device 12, or at a position higher than the upper end e2. As a result, light emitted from the light-emitting device section (light-emitting device 11a) is less likely to be blocked by the drive device 12, which allows for suppression of narrowing of the viewing angle. Such a configuration makes it possible to achieve the effects similar to those in the above-described first embodiment.

Modification Examples 2-1 to 2-3

Moreover, in the above-described ninth embodiment, the following structure may be further adopted. In other words, as with Modification Example 2-1 illustrated in FIG. 28, a light-shielding layer 40 made of, for example, aluminum (Al) may be patterned at a region that is superposed on a lead-out wiring line 142 in a layer between the second substrate 110 and the detachment layer 120. Further, as with Modification Example 2-2 illustrated in FIG. 29, on the light-emitting device 11a, a carbon CVD film may be formed under a seed layer 41 to be used for plating formation of a Cu wiring layer 42, and such a carbon CVD film may be configured to also serve as a light-shielding layer. In addition, as with Modification Example 2-3 illustrated in FIG. 30, a configuration may also be adopted that takes out lead-out wiring lines 150a from side surfaces of the light-emitting devices 11R, 11G, and 11B instead of top surfaces thereof.

The disclosure is described thus far with reference to the embodiments and modification examples; however, the disclosure is not limited to the embodiments and modification examples, but various modifications may be made. For example, in the above-described embodiments and modification examples, the description is provided taking as an example a case where the light-emitting device section includes three light-emitting diode chips of R, G, and B. However, the light-emitting device section may further include light-emitting diode chips of any other colors, or may include light-emitting diode chips of other colors instead of any of the light-emitting diode chips of R, G, and B.

It is to be noted that the disclosure may also be configured as follows.

(1)

A display unit provided, on a substrate, with a first wiring layer and a device section having a plurality of pixels, the device section including, in each of the pixels:

a light-emitting device section that includes a light-emitting device and a light-emitting surface; and a drive device that drives the light-emitting device section and is electrically coupled to the light-emitting device section through the first wiring layer, in which an end of the light-emitting surface of the light-emitting device section is disposed at a position as high as an upper end of the drive device, or at a position higher than the upper end.

(2)

The display unit according to (1), in which the light-emitting device section is provided with a first insulating film on substrate side of the light-emitting device), in which a total of a thickness of the first insulating film and a thickness of the light-emitting device is equal to or greater than a thickness of the drive device.

(3)

The display unit according to (1) or (2), further including a second insulating film having a first recessed portion at a selective region, the second insulating film being provided between the substrate and the light-emitting device section as well as the drive device, the drive device being formed to allow a portion of the drive device to be embedded into the first recessed portion of the second insulating film.

(4)

The display unit according to any one of (1) to (3), further including a sealing layer that covers the drive device and the light-emitting device section, the light-emitting device section including a high-refractive-index layer having a refractive index that is higher than a refractive index of the sealing layer, the high-refractive-index layer covering the light-emitting device and having the light-emitting surface.

(5)

The display unit according to (4), in which a maximum value of an emission angle of light emitted from an end of the light-emitting surface of the high-refractive-index layer is 90 degrees.

(6)

The display unit according to (5), in which a refractive index and a thickness of the high-refractive-index layer satisfy the following conditional expression (A):

$$n0/n1 < L1/(H1^2 + L1^2)^{1/2} \qquad \text{(A)}$$

where
  n0 is a refractive index of the sealing layer,
  n1 is a refractive index of the high-refractive-index layer,
  L1 is a thickness of the high-refractive-index layer facing a side surface of the light-emitting device, and
  H1 is a thickness of the high-refractive-index layer facing the light-emitting surface of the light-emitting device.

(7)
The display unit according to (1), in which the light-emitting device is formed to be embedded into a portion of the drive device.

(8)
The display unit according to (7), in which
the drive device has a second recessed portion at a selective region, and
the light-emitting device is formed inside the second recessed portion.

(9)
The display unit according to (8), further including a third insulating film that serves to adjust a height of the light-emitting surface on a bottom surface of the second recessed portion.

(10)
The display unit according to any one of (1) to (9), in which the drive device has a tapered shape.

(11)
The display unit according to (10), in which a cross-sectional shape of the drive device is trapezoidal.

(12)
The display unit according to any one of (1) to (11), further including a light-shielding film that is formed to cover a surface of the drive device.

(13)
The display unit according to any one of (1) to (12), further including an antireflective film that is formed to cover a surface of the drive device.

(14)
The display unit according to any one of (1) to (13), further including a connection wiring line for electrical coupling between the light-emitting device and the drive device, the connection wiring line being interposed between the light-emitting device and the drive device to serve as a light-shielding layer as well.

(15)
The display unit according to (14), in which the connection wiring line is formed of a through-silicon via.

(16)
The display unit according to any one of (1) to (15), further including a seed layer that is superposed on the drive device and is used to form a metallic wiring line through plating, the seed layer being interposed between the light-emitting device and the drive device to serve as a light-shielding layer as well.

(17)
The display unit according to any one of (1) to (16), further including a light-shielding resin layer that is formed to be embedded between the light-emitting device and the drive device.

(18)
The display unit according to (17), in which the light-shielding resin layer is embedded between the pixels and between the light-emitting device and the drive device to serve as a planarizing layer as well.

This application is based upon and claims the benefit of the priority of Japanese Patent Application No. 2015-015843 filed with Japan Patent Office on Jan. 29, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display unit provided, on a substrate, with a first wiring layer and a device section having a plurality of pixels, the device section comprising, in each of the pixels:
   a light-emitting device section that includes a light-emitting device and a light-emitting surface; and
   a drive device that drives the light-emitting device section and is electrically coupled to the light-emitting device section through the first wiring layer,
   wherein the light-emitting device section is coupled to the first wiring layer through a single insulating film directly contacting a majority of a surface of the light-emitting device section closest to the first wiring layer,
   wherein the first wiring layer is disposed at a position lower than the drive device, and
   wherein an end of the light-emitting surface of the light-emitting device section is disposed at a position as high as an upper end of the drive device, or at a position higher than the upper end.

2. The display unit according to claim 1, wherein the light-emitting device section is provided with a first insulating film on substrate side of the light-emitting device, wherein a total of a thickness of the first insulating film and a thickness of the light-emitting device is equal to or greater than a thickness of the drive device.

3. The display unit according to claim 1, further comprising a second insulating film having a first recessed portion at a selective region, the second insulating film being provided between the substrate and the light-emitting device section as well as the drive device, the drive device being formed to allow a portion of the drive device to be embedded into the first recessed portion of the second insulating film.

4. The display unit according to claim 1, further comprising a sealing layer that covers the drive device and the light-emitting device section, the light-emitting device section including a high-refractive-index layer having a refractive index that is higher than a refractive index of the sealing layer, the high-refractive-index layer covering the light-emitting device and having the light-emitting surface.

5. The display unit according to claim 4, wherein a maximum value of an emission angle of light emitted from an end of the light-emitting surface of the high-refractive-index layer is 90 degrees.

6. The display unit according to claim 5, wherein a refractive index and a thickness of the high-refractive-index layer satisfy the following conditional expression (A):

$$n0/n1 < L1/(H1^2 + L1^2)^{1/2} \qquad (A)$$

where
  n0 is a refractive index of the sealing layer,
  n1 is a refractive index of the high-refractive-index layer,
  L1 is a thickness of the high-refractive-index layer facing a side surface of the light-emitting device, and
  H1 is a thickness of the high-refractive-index layer facing the light-emitting surface of the light-emitting device.

7. The display unit according to claim 1, wherein the light-emitting device is formed to be embedded into a portion of the drive device.

8. The display unit according to claim 7, wherein
the drive device has a second recessed portion at a selective region, and the light-emitting device is formed inside the second recessed portion.

9. The display unit according to claim 8, further comprising a third insulating film that serves to adjust a height of the light-emitting surface on a bottom surface of the second recessed portion.

10. The display unit according to claim 1, wherein the drive device has a tapered shape.

11. The display unit according to claim 10, wherein a cross-sectional shape of the drive device is trapezoidal.

12. The display unit according to claim 1, further comprising a light-shielding film that is formed to cover a surface of the drive device.

13. The display unit according to claim 1, further comprising an antireflective film that is formed to cover a surface of the drive device.

14. The display unit according to claim 1, further comprising a connection wiring line for electrical coupling between the light-emitting device and the drive device, the connection wiring line being interposed between the light-emitting device and the drive device to serve as a light-shielding layer as well.

15. The display unit according to claim 14, wherein the connection wiring line is formed of a through-silicon via.

16. The display unit according to claim 1, further comprising a seed layer that is superposed on the drive device and is used to form a metallic wiring line through plating, the seed layer being interposed between the light-emitting device and the drive device to serve as a light-shielding layer as well.

17. The display unit according to claim 1, further comprising a light-shielding resin layer that is formed to be embedded between the light-emitting device and the drive device.

18. The display unit according to claim 17, wherein the light-shielding resin layer is embedded between the pixels and between the light-emitting device and the drive device to serve as a planarizing layer as well.

19. The display unit according to claim 1, wherein the single insulating film is disposed at a position lower than the drive device.

* * * * *